United States Patent
Lye

(10) Patent No.: US 9,094,033 B1
(45) Date of Patent: Jul. 28, 2015

(54) QUANTIZATION NOISE-SHAPING DEVICE

(71) Applicant: PMC-SIERRA US, INC., Sunnyvale, CA (US)

(72) Inventor: William Michael Lye, Coquitlam (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 14/604,024

(22) Filed: Jan. 23, 2015

(51) Int. Cl.
| | |
|---|---|
| *H03M 1/66* | (2006.01) |
| *H03M 1/06* | (2006.01) |
| *H03M 1/68* | (2006.01) |
| *H03M 1/82* | (2006.01) |
| *H03M 1/74* | (2006.01) |
| *H03M 1/00* | (2006.01) |

(52) U.S. Cl.
CPC ............ *H03M 1/0602* (2013.01); *H03M 1/687* (2013.01); *H03M 1/82* (2013.01); *H03M 1/00* (2013.01); *H03M 1/747* (2013.01)

(58) Field of Classification Search
CPC ................................ H03M 1/00; H03M 1/747
USPC ................ 341/145, 144, 150, 152, 118
See application file for complete search history.

(56) References Cited

U.S. PATENT DOCUMENTS

| | | |
|---|---|---|
| 5,596,609 A | 1/1997 | Genrich et al. |
| 7,873,227 B2 | 1/2011 | Geiger et al. |
| 2011/0199247 A1* | 8/2011 | van Veldhoven et al. ..... 341/143 |

OTHER PUBLICATIONS

Hogenauer, Eugene B., "An Economical Class of Digital Filters for Decimation and Interpolation", IEEE Transactions on Acoustics, Speech, and Signal Processing, vol. ASP, No. 2, Apr. 2, 1981, pp. 155-162.

Norsworthy, Schreier, Gabor, Temes, "Delta-Sigma Data Converters: Theory, Design, and Simulation", Chapter 10 , Oct. 1996, pp. 309-332.

* cited by examiner

*Primary Examiner* — Joseph Lauture
(74) *Attorney, Agent, or Firm* — Dennis R. Haszko

(57) ABSTRACT

A device that performs Quantization Noise-Shaping and operates at high clock rates. The device can be implemented in parallel with large parallelization factors to produce extremely high throughput. The device has two feed-forward filters that can be implemented using standard parallel Digital Signal Processing techniques. The device can be used in various systems such as Digital-to-Analog Converter (DAC) system and Fractional-N frequency synthesis systems.

17 Claims, 18 Drawing Sheets

QUANTIZATION NOISE-SHAPING DEVICE

FIELD

The present disclosure relates to Quantization Noise Shaping.

BACKGROUND

When building Digital-to-Analog Converters (DACs), there are many techniques that may be used. Depending upon the characteristics of the digital signal being recreated in the analog domain and on the required system characteristics, a DAC designer is free to choose from among all these techniques in order to best suit their application.

The generic DAC system shown in FIG. 1 demonstrates a number of features that are common to most systems that involve a DAC. An N-bit digital input signal and a sample clock are driven into the actual DAC (180). The output from the DAC is a discrete-time analog signal, where the digital signal has been represented in the analog domain by a series of discrete signal levels that change at discrete times governed by the sample clock. This discrete-time analog signal is then filtered by an analog reconstruction filter (190) to produce a continuous-time analog output. Depending upon the application, the DAC output can be represented in a number of different domains, including (but not limited to) voltage, current, charge, and pulse width. Depending upon the application, the reconstruction filter complexity and construction can vary widely, and in certain applications may not exist; in these applications the system does not require a continuous-time analog output but instead operates directly from the discrete-time output of the DAC.

Three of the most important characteristics of a system are the DAC resolution (the width of the digital sample bus), the DAC sample rate (the frequency at which the data is updated), and the signal bandwidth (what fraction of the available bandwidth the sample rate allows that the signal actually occupies).

The DAC resolution is fundamental in that it determines what the Quantization Noise (QN) of the signal is, and in turn the QN sets a fundamental floor on how accurate the representation of an ideal signal by digital approximation is. In general, the resolution of a DAC at its input is often expressed by the digital signal bit width, and the resolution at the DAC output is expressed in Least Significant Bits, or LSBs. One LSB is the minimum value that a signal at the discrete time output from a DAC can differ from any other signal at any other time. The QN is, in general, a uniform error with a width equal to one LSB, and appears as a white (i.e. flat) noise source in the frequency domain. A DAC with a larger number of bits at its input will have a higher resolution and therefore a lower QN.

Nyquist Vs. Oversampled DAC Systems

One common way of categorizing DAC systems is based on the signal bandwidth; in a "Nyquist" system the signal bandwidth can be as large as half the sample rate (i.e. the Nyquist bandwidth), however in many other systems typically referred to as "Oversampled" systems the signal bandwidth is smaller (and often much smaller, perhaps as low as $1/100$ or $1/1000$) of the Nyquist bandwidth.

There are many reasons to construct Oversampled DAC systems, many of which are well beyond the scope of the present disclosure, however one of the most important reasons in recent years has been to trade off sample rate for digital resolution. Practically speaking, this means that for a constant signal bandwidth, it is possible to trade off resolution in amplitude (i.e. digital resolution) for resolution in time (i.e. sample rate), allowing systems with higher sample rates to have lower digital resolution and yet have the same accuracy.

For Nyquist systems with a sample rate $F_{DACNYQUIST}$ with N-bit quantization, the Signal-to-Noise Ratio (SNR) due to Quantization, also known as Signal-to-Quantization Noise Ratio (SQNR), over the full Nyquist signal band $F_{DACNYQUIST}/2$ for a full-scale sine wave signal is well known to be given by Equation 1:

$$SQNR_{NYQUIST} = 1.76 \text{ dB} + N \cdot 6.02 \text{ dB} \qquad \text{Equation 1}$$

If a Nyquist DAC were to run at a faster rate, $M \cdot F_{DACNYQUIST}$, the SQNR would remain constant, with the QN spread across a wider bandwidth $M \cdot F_{DACNYQUIST}/2$. If instead this DAC were treated as an Oversampled DAC with a sample rate $M \cdot F_{DACNYQUIST}$ (the factor M is also known as the Oversample Ratio or OSR) the resulting SQNR over the original signal bandwidth $F_{DACNYQUIST}/2$ is given by Equation 2:

$$SQNR_{OVERSAMPLED} = 1.76 \text{ dB} + \left(N + \frac{M}{4}\right) \cdot 6.02 \text{ dB} \qquad \text{Equation 2}$$

In other words, if an Oversampled DAC can be run with an OSR of 4, it can operate with one fewer bit on the digital input signal than the equivalent Nyquist DAC. For many DAC circuit architectures, reducing the digital input by one bit can result in a reduction in circuit complexity by half, therefore the higher the OSR the easier the DAC is to build.

Another advantage to building an Oversampled DAC instead of a Nyquist DAC is in the simplification of the reconstruction filter 180. In the frequency domain, the discrete-time analog signal output from the DAC will have copies of the digital input signal located around $P \cdot F_{DAC}$, where P are all possible integers, both positive and negative. Usually, only one of these copies (often P=0, i.e. around DC) is desired and the others are undesirable "images", and the reconstruction filter is used to attenuate all images while passing the desired signal to the analog output. The closer in frequency the desired signal is to its immediate neighbor images, the harder (or more expensive) the reconstruction filter is to design, requiring either a high-order design, high-accuracy and/or high quality components, or both. For Oversampled DAC systems, the higher the OSR the further apart the images are in frequency from the desired signal, therefore the lower the reconstruction filter complexity (and cost) will be.

As digital circuit complexities have grown significantly over the last several decades, minimum transistor drawn sizes have shrunk, voltage rails have dropped, and transistor speeds have increased. These smaller transistors and lower voltage rails have, in general, resulted in poorer analog performance for any block that is integrated onto the same die as a digital circuit. This reduced analog performance has made the design of the DAC and reconstruction filter harder. At the same time, however, the increase in transistor speed has made Oversampled DAC structures easier to build, somewhat compensating for the poorer analog performance.

Quantization Noise Shaping

Equation 2 describes the SQNR of an Oversampled DAC that comes only from increasing sample rate. Beyond this, SQNR can be further improved by also doing Quantization Noise Shaping (QNS). In QNS systems, discrete-time filters are wrapped around a quantizer, and as a result the Quantization Noise can be filtered (or "Shaped") to reduce its amplitude in the signal band.

One particular form of QNS is the Delta-Sigma Modulator, also variously known as a DSM, Δ-Σ Modulator, ΔΣM, Sigma-Delta Modulator, SDM, Σ-Δ Modulator, or ΣΔM. A DSM is shown in FIG. 2. A high-resolution input signal X is combined with the output Y of a quantizer (240) through two discrete time filters (a Feed-Forward Filter $F_{DSM}(z)$ 210 and Feed-Back Filter $G_{DSM}(z)$ 220) and an addition block (230), and fed as input into the quantizer. The quantizer is a nonlinear element, producing an output that has reduced amplitude resolution (i.e. fewer number of discrete signal levels) compared to its input. The input can itself be quantized (i.e. it has a number of discrete signal levels) or it can be a continuous (i.e. analog) input. In the extreme situation, the quantizer can be implemented as a simple slicer, producing a single bit output. In order to analyze a DSM, a simplifying assumption is often made, replacing the quantizer with an additional adder and a uniform QN source (also known as the "Quantization Error" or E), which results in the small signal model shown in FIG. 3. For clarity, FIG. 3 and all succeeding figures use the same numeric identifiers to identify components that are in common with earlier figures, and furthermore will use similar numbers to identify similar components.

FIG. 3 shows how the quantization error E is added (using the addition block 340) to the system in place of the quantizer 240 of FIG. 2. This substitution converts the nonlinear circuit of FIG. 2 into a linear model that we can analyze in Equation 3:

$$Y = \frac{F_{DSM}(z)}{1 - F_{DSM}(z) \cdot G_{DSM}(z)} \cdot X - \frac{1}{1 - F_{DSM}(z) \cdot G_{DSM}(z)} \cdot E = \quad \text{Equation 3}$$

$$STF_{DSM}(z) \cdot X + NTF_{DSM}(z) \cdot E$$

$$STF_{DSM}(z) = \frac{F_{DSM}(z)}{1 - F_{DSM}(z) \cdot G_{DSM}(z)}$$

$$NTF_{DSM}(z) = \frac{1}{1 - F_{DSM}(z) \cdot G_{DSM}(z)}$$

Equation 3 introduces two new terms, the Signal Transfer Function $STF_{DSM}(z)$ and the Noise Transfer Function $NTF_{DSM}(z)$, which are the filters that the signal input X and error input E see at the output Y respectively.

If a DSM has a $STF_{DSM}(z)$ greater than $NTF_{DSM}(z)$ (i.e. F(z)>1) in a certain frequency band, the SQNR due to QNS in in this band will be greater than that of an Oversampled system that does not use QNS. Note that this observation holds no matter what the form Equation 3 takes; while many QNS systems are low-pass and are used to suppress QN at low frequencies (close to DC, sometimes referred to as Baseband or BB), it is just as valid to build a band-pass QNS system that suppresses QN in a narrow band around another frequency, potentially a Radio Frequency (RF) or an Intermediate Frequency (IF).

In general the order of $NTF_{DSM}(z)$ will determine how much QN will be suppressed and therefore how much the SQNR is improved for a given OSR, and in general a higher-order $NTF_{DSM}(z)$ will have a better SQNR than a lower-order one. However at the same time, the nonlinearities of the quantizer mean high-order $NTF_{DSM}(z)$'s often end up being unstable, which makes for a challenging design task and often results in a severely limited input signal range, especially for a DSM that uses a 1-bit quantizer.

An alternative QNS system known as an Error Feedback Modulator (EFM), is shown in FIG. 4. As with a DSM, an EFM uses the quantizer 240 to produce a low-resolution output Y, however where a DSM feeds Y back to be combined with the X, an EFM uses an additional subtraction block 450 to calculate the quantization error and then feeds this back instead. As with the DSM, the EFM uses a Feed-Forward Filter $F_{EFM}(z)$ 410 and Feed-Back Filter $G_{EFM}(z)$ 420, however the filter designs tend to be different between the two blocks.

As with the DSM, the small-signal model of an EFM is created by replacing the quantizer with E and an addition element 540, as shown in FIG. 5, and as with the DSM, this model can be solved as shown in Equation 4. As with Equation 3, any frequency band where Equation 4's $STF_{EFM}(z)$ is greater than $NTF_{EFM}(z)$ will have an increased SQNR compared with an Oversampled system that does not use QNS.

$$Y = F_{EFM}(z) \cdot X + (1 + F_{EFM}(z) \cdot G_{EFM}(z)) \cdot E$$

$$= STF_{EFM}(z) \cdot X + NTF_{EFM}(z) \cdot E$$

$$STF_{EFM}(z) = F_{EFM}(z)$$

$$NTF_{EFM}(z) = 1 + F_{EFM}(z) \cdot G_{EFM}(Z) \quad \text{Equation 4}$$

Comparing Equation 3 with Equation 4, the forms that $STF_{EFM}(z)$ and $NTF_{EFM}(z)$ take are very different compared to $STF_{DSM}(z)$ and $NTF_{DSM}(z)$. In order for a low-pass DSM to pass signals around DC, $F_{DSM}(z)$ must take the form of an integrator with a large gain at DC, while for an EFM, $F_{EFM}(z)$ takes the form of a flat gain (perhaps even unity) across all frequencies. This difference, in turn, means that $STF_{DSM}(z)$ will not be flat across all frequencies and will tend to have signal amplitude droops close to the band edges, whereas an EFM will have a flat $STF_{EFM}(z)$. Finally, because $F_{DSM}(z)$ for a high-SQNR DSM takes the form of an high-order integrator, the DSM stability challenge is significantly harder than for an EFM.

QNS can be applied both to Analog/Digital Converters (ADCs) and Digital/Analog Converters, however ADCs tend to be implemented using the DSM structure, whereas DACs tend to be implemented using the EFM structure. This is because in an ADC, the QNS is a full analog system and the EFM error subtraction block 450 is an extremely challenging block to construct, whereas in a DAC, QNS is implemented using a full Digital Signal Processing (DSP) system and the error subtraction block is trivial.

In addition to applications in ADC and DAC systems, QNS also finds use in several other applications, such as in Fractional-N based frequency synthesis and in network timing jitter control. Applications in these areas and in others are beyond the scope of this disclosure; however the underlying implementations of QNS tend to be similar.

Multi-Bit Error Feed-Back Modulation DAC Systems

For Audio DAC applications, where the signal frequency content goes from DC to approximately 20 kHz, many existing DAC systems use a high-order QNS 1-bit DAC operating at sample rates comprised between 2 and 20 MHz, resulting in OSR's of 100 to 1000 or more. However for DSP modulation based communication systems, such as Digital Subscriber Line (DSL), and various RF technologies (such as WiFi, Cellular RF, WPAN, and more) the signal frequency content can be significantly higher, up to 100's of MHz or potentially even GHz, and it is simply impractical to build DACs with such extremely high OSRs. As a result, all such systems are built using multi-bit DACs. If the application and technology support it, these DACs may be built as Oversampled DACs and take advantage of QNS to further improve their resolution and reduce their SQNR while reducing the complexity of the analog portions of the designs. In addition to QNS, there are several additional techniques that a DAC system designer will likely use to minimize the effects of circuit non-idealities on the output signal's SNR, however these are beyond the scope of this disclosure.

A practical EFM Multi-Bit DAC system is shown in FIG. 6. A high-resolution digital input X is fed through a modified EFM structure to produce a lower-resolution intermediate digital signal Y, which in turn drives the DAC 680 and Reconstruction Filter 690 to produce the analog output signal. Comparing this figure to the generic EFM of FIG. 4, the Feed-Forward Filter 210 is removed to produce a flat $STF_{EFM}(z)$, leaving just the DSP Feed-Back Filter 620. The Quantizer 240 and Subtractor 450 are implemented with two nonlinear operators, an "MSB" operator 640 and an "LSB" operator 650, which trivially split the output from the adder 630 into two portions, one consisting of a number of the Most Significant Bits (MSB's, often referred to as "integer" bits) which will go to the output and the second consisting of the remaining Least Significant Bits (LSB's, often referred to as "fractional" bits) which form the digital error feed-back signal. In order to keep the width of the digital busses within the EFM under control, a second set of MSB/LSB operators (641 and 651) are often used to split X into integer and fractional portions (XINT and XEFM), allowing the EFM to only operate on the fractional bits XEFM. This in turn requires a final adder 631 to combine XINT with the output from the EFM, YEFM, to produce the output Y.

Implementing QNS elements (specifically elements 620, 630, 640, and 650) for the system of FIG. 6 is described below.

Efficient DSP Filters Using Sum-of-Products Structures

One of the most important structures in most DSP filters is a so-called Sum-Of-Products or SOP structure, and the implementation of SOP structures often determines the area and power of a DSP block. The most important SOP structure variant involves constant multipliers of a number of delayed versions of an input signal, described by Equation 5:

$$Y = B_{0,0} \cdot X + B_{0,1} \cdot X \cdot z^{-1} +$$
$$B_{0,2} \cdot X \cdot z^{-2} + \ldots + B_{0,N} \cdot X \cdot z^{-N}$$
$$= X \cdot \sum_{i=0}^{N} B_{0,i} \cdot z^{-i}$$
$$H_0(z) = \frac{Y}{X} = \sum_{i=0}^{N} B_{0,i} \cdot z^{-i}$$

Equation 5

The filter $H_0(z)$ described in Equation 5 is a Finite Impulse Response (FIR) filter; Infinite Impulse Response (IIR) filters may also be implemented using SOP structures and are discussed further below, however it is easier to discuss efficient implementation techniques of FIR filters first. FIGS. 7A and 7B show the two most common SOP FIR Filters. FIG. 7A is the Direct Form I (DF-I) structure, which uses a series of delay elements 710 to create multiple delayed versions of the input X, each of which is multiplied by a constant factor using the multiplication elements 720, then added together with the adder elements 730 to produce the output Y. The SOP structure is readily seen to be built from the multiplication and addition elements. FIG. 7B is the Direct Form II (DF-II) structure, which drives all multiplication elements with X (instead of delayed versions of X as in the DF-I structure) and places delay elements 712 into output adder chain instead. DF-I and DF-II structures are mathematically identical, but create separate implementation challenges.

Efficient SOP implementations focus on using low-cost (both in area and power) implementations for the multiplication elements 720 and the addition elements 730, and in almost all cases involve merging them together into a single structure. Efficient multiplication is normally accomplished using Canonical Signed Digit (CSD) techniques, replacing arbitrary multiplication operations by a series of additions and subtractions of power-of-2 factors, which can be implemented very efficiently by shifting the bits of the input left or right. Efficient addition is normally performed by minimizing the number of carry propagate operations and by combining multiple additions together using Carry Save Arithmetic (CSA) techniques, which produce a redundant output form that requires a final Carry Propagate Adder (CPA) to produce the final output.

FIGS. 8A and 8B show DF-I and DF-II FIR structures using CSD and CSA techniques. The CSD elements 820 replace the multiplication elements 720, producing several shifted (i.e. multiplied by a power of two) versions of their inputs. In the DF-I structure of FIG. 8A, all CSD outputs are added together using a single very wide CSA structure 830, producing a redundant partial sum that is combined by the CPA 835 to produce Y. In the DF-II structure of FIG. 8B, double-wide delay elements 812 propagate the redundant outputs from multiple fewer-input (i.e. narrower) CSA structures 831, which eventually produce a redundant partial sum that is combined by the CPA 835 to produce Y. In addition to the use of CSD and CSA techniques, there are several additional area and power optimizations that come from combining common CSD/CSA sub-expressions which further improve implementation efficiency however these optimizations are well beyond the scope of the present disclosure.

Which structure, DF-I or DF-II, is most efficient depends heavily on the situation in which they are being used. In the DF-I structure, the critical path from X (or from the outputs of the delay elements 710) to Y passes through the CSD elements 820, the CSA 830, and the CPA 835. The CSD elements, consisting only of wires, are extremely fast. The CSA, because it does not need to propagate carry bits, is fast with relatively shallow logic cones, however the CPA is generally either slow because of deep logic cones for the simplest adder structures or it has a large gate count (and therefore a large area and power) when using faster and more advanced adder structures. At high clock rates, meeting digital timing through the CSD/CSA/CPA combination can be quite challenging, requiring large areas and/or high power dissipation. A common solution to the problem, shown in FIG. 9, is to insert an explicit pipeline register (an additional double-wide delay element) 913 between the CSA and CPA, allowing more time for the CSD/CSA structure and the CPA to evaluate. In extreme situations, meeting timing may even require the insertion of additional pipeline registers inside the CSA and/or the CPA, effectively increasing the pipeline delay 913. These additional pipeline registers add latency through the filter, which may have to be accounted for elsewhere in the system.

As with the DF-I structure, the DF-II structure's critical path is through the CSD elements 820, the CSA elements 831, and the CPA 835. As with the DF-I structure, pipeline registers can be inserted between the final CSA and the CPA, and they can also be inserted into the CPA. Because the DF-II CSA elements 831 are narrower than the DF-I CSA element 830, they tend to be faster. However unlike the DF-I structure, it is impossible to add pipeline registers into the CSA because these registers change the filter response, not just change the latency. At the same time, the double-wide delay elements 812 tend to increase both area and power, and DF-II structures also tend to have fewer available optimizations due to common CSD/CSA sub-expressions than do their DF-I equivalents. Finally, DF-II structures don't lend themselves well to parallel DSP implementations which will be discussed later. As a result of all these, DF-II structures tend not to be used at the highest clock rates, therefore the remainder of this disclosure will focus on DF-I structures.

IIR filters, in which the output is a function of previous outputs in addition to the inputs, can also be implemented using SOP structures. An IIR filter is described by Equation 6 and a DF-I structure that implements $H_0(z)$ from Equation 6 is shown in FIG. 10. Comparing this structure to FIG. 7A, the FIR ($B_{0,i}$) portion appears in the delay elements 1010, the multiplication elements 1020, and the addition elements 1030. The IIR ($A_{0,i}$) portion which feeds the Y output back into the filter, appears as delay elements 1011, multiplication elements 1021, and re-uses addition elements 1030.

$$Y = B_{0,0} \cdot X + B_{0,1} \cdot X \cdot z^{-1} + \qquad \text{Equation 6}$$
$$B_{0,2} \cdot X \cdot z^{-2} + \ldots + B_{0,N} \cdot X \cdot z^{-N} +$$
$$A_{0,1} \cdot Y \cdot z^{-1} + A_{0,1} \cdot Y \cdot z^{-2} + \ldots + A_{0,N} \cdot Y \cdot z^{-N}$$
$$= X \cdot \sum_{i=0}^{N} B_{0,i} \cdot z^{-i} + Y \cdot \sum_{i=1}^{N} A_{0,i} \cdot z^{-i}$$

$$H(z) = \frac{Y}{X} = \frac{\sum_{i=0}^{N} B_{0,i} \cdot z^{-i}}{1 - \sum_{i=1}^{N} A_{0,i} \cdot z^{-i}}$$

Similar to FIG. 8A, FIG. 11 shows a DF-I IIR filter implemented using CSD and CSA techniques. As before, the generic multipliers 1020 and 1021 are replaced with CSD multiplication elements 1120 and 1121, whose multiple outputs are added together with the wide CSA adder 1130 and the CPA 1135.

As with FIG. 8A, the structure in FIG. 11 has a critical timing path, originating from X or from one of the delay units 1010 or 1011, going through one of the CSD multiplication elements 1120 or 1121, through the CSA 1130 and finally the CPA 1135. In order to better meet timing, a pipeline register can be added between the CSA and CPA, as is shown in FIG. 12. Similar to FIG. 9, the pipeline register (a double-wide delay element 1213) is added between the CSA and CPA, and the feedback to the multiplication elements is taken from the newly-delayed redundant output. The single-wide delay elements 1011 are replaced with double-wide delay elements 1211 and the feedback multiplication CSD elements 1221 are modified to use the redundant feedback. Finally, in order to keep the filter transfer function $H_0(z)$ identical, one of the feedback delay elements is removed, effectively replaced by the pipeline register 1213. As with FIG. 9, this pipeline register will increase the filter latency, and this may need to be accounted for elsewhere in the system.

If the structure in FIG. 12 still has a critical timing path that is too long, the designer can't simply increase the pipeline delay 1213 as is possible with the similar FIR structure because this will modify the filter response. Instead, the filter may be unrolled with the recurrence relation in Equation 7, which has a starting point $H_0(z)$ from Equation 6. All succeeding forms of $H_j(z)$ are built by "unrolling" $H_{j-1}(z)$ one clock cycle in order to calculate the previous version of Y, then applying substitution and simplification rules, taking advantage of the fact that standard addition and multiplication operators are both commutative and distributive. Each unrolling operation increases the length of the FIR ($B_{j,i}$) portion by one tap and increases the order of the exponent of $z^{-1}$ in the IIR ($A_{j,i}$) portion by one, therefore increasing the allowed latency in the feedback path. There are other similar transformations that also allow increased latency in the feed-back loop of an IIR filter, but given their net effect is the same there is no reason to discuss them in this disclosure. There are several practical considerations for coefficient sensitivity and noise amplification that should also be considered when unrolling an IIR filter, however these are beyond the scope of the present disclosure.

$$Y = X \cdot \sum_{i=0}^{N+j} B_{j,i} \cdot z^{-i} + Y \cdot \sum_{i=1+j}^{N+j} A_{j,i} \cdot z^{-i} \Bigg|_{j \geq 0} \qquad \text{Equation 7}$$

$$B_{j,i} = \begin{cases} B_{j-1,i} & i = 0 \\ B_{j-1,i} + A_{j-1,i} \cdot B_{j-1,i} & i = 1 \ldots N+j-1 \\ A_{j-1,i} \cdot B_{j-1,i} & i = N+j \end{cases}$$

$$A_{j,i} = \begin{cases} A_{j-1,i} + A_{j-1,i} \cdot B_{j-1,i} & i = 1+j \\ A_{j-1,i} \cdot B_{j-1,i} & i = N+j \end{cases} \Bigg|_{j > 0}$$

$$H_j(z) = \frac{\sum_{i=0}^{N+j} B_{j,i} \cdot z^{-i}}{1 - \sum_{i=1+j}^{N+j} A_{j,i} \cdot z^{-i}} \Bigg|_{j \geq 0}$$

From a practical perspective, this means that if evaluating the CSA 1130 for $H_0(z)$ requires three clock cycles in order to meet timing, the filter can be unrolled twice, and $H_2(z)$ can be implemented as shown in FIG. 13. The CSA pipeline delay 1313 is increased from one cycle to three and the Feed-Forward and Feed-Back multiplication elements 1320 and 1321 are modified to use the unrolled filter values.

Efficient Parallel DSP Filters Using Sum-of-Products Structures

Even with the unrolled filter structure of FIG. 13, the maximum throughput of a DSP filter will be limited by the maximum implementable clock rate because this is a serial filter, operating on one input sample every clock cycle. For example, if a digital core can operate with a maximum feasible 1 GHz clock rate, the maximum sample rate of the filter is limited to 1 Gigasamples per second (i.e. 1 Gsps). In order to operate on higher sample rate signals (for example 8 Gsps), the DSP filter must be implemented using parallel techniques, i.e. operate on parallel blocks of data. Each data block consists of a number of successive input samples and produces a number of successive samples, and all operations are performed in parallel. The block width (often written as "P") determines the degree of parallelization in the system, and is determined by the required improvement in throughput. For example, in the case of 8 Gsps operation with a 1 GHz clock, we require P=8. A naïve parallel implementation of FIG. 12 with P=2 (the minimum for "parallel" operation) is shown in FIG. 14. The increased complexity of this structure requires a significant change in drawing style compared to previous figures; however as before similar elements have been given similar identification numbers to make comparisons easier.

The two-wide input signal block consists of the signals X and $X \cdot z^{-1}$, while the two-wide output signal block consists of the signals Y and $Y \cdot z^{-1}$. Delayed versions of the input signal block are produced by the delay elements 1410, which take the form $z^{-2}$ reflecting the fact that each clock edge delays the signal by the block width (P=2). Similarly-delayed versions of the output signal block (in redundant form) are produced by the delay elements 1411. Appropriately-delayed versions of the input and outputs are fed into two identical merged CSD/CSA structures 1430 and 1431. Each CSD/CSA structure combines elements 1120, 1221, and 1230 and embodies the required Sum-of-Products structure in order to implement $H_0(z)$. Finally, the redundant CSD/CSA outputs are combined by two CPA structures 1435 to produce the output signal block. As before, pipeline delay elements can be added to the CPA structures in order to improve timing, however pipeline delay inserted into either CSD/CSA structure will change the filter response. Higher parallelization factors (P>2) can be readily constructed by interconnecting multiple CSA/CSA structures with delay units $z^{-P}$ in a manner similar to FIG. 14.

The throughput of this naïve parallel structure is no better than the serial structure because the critical path goes through both CSD/CSA structures: the output from 1430 feeds directly into the $A_{0,1}$ input of 1431. As a result, the critical path of FIG. 14 is twice as long as in FIG. 12, which means that its maximum clock rate is cut in half, which cancels the throughput improvement that would otherwise be achieved by using a parallel structure.

The structure in FIG. 15 avoids this limitation by replacing the CSD/CSA structure 1431 which implements $H_0(z)$ with the structure 1531 which implements $H_1(z)$, i.e. the once-unrolled version of $H_0(z)$ described by Equation 7. This removes the $A_{0,1}$ input (replacing it with $A_{1,N+1}$ and $B_{1,N+1}$) and as a result the output from 1430 no longer feeds directly into 1531. Instead, one of the delay registers 1411 appears between 1430 and 1531 which cuts the critical path in half and approximately doubles the throughput. If the CSD/CSA structures have difficulty meeting timing, both 1430 and 1531 can be unrolled twice to produce $H_2(z)$ and $H_3(z)$, which in turn allows an increased latency of two samples in the feed-back loop, meaning that an additional pipeline delay register $z^{-2}$ can be inserted into the CSD/CSA structures. Additional pipeline registers can be inserted by unrolling the filter further.

In general, it is possible to transform a serial IIR filter $H_0(z)$ implemented with a structure of FIG. 12 into a parallel equivalent with a block size P by applying Equation 7 to produce P–1 delayed versions of $H_0(z)$. The P filters $H_0(z)$ through $H_{P-1}(z)$ are then implemented using efficient CSD/CSA Sum-of-Products implementations and connected with delay registers (with values $z^{-P}$) in a manner similar to FIG. 15, with the end result that the resulting parallel filter has P times the throughput of the original serial filter. For block sizes P>2, the drawing of the resulting filter will be significantly more complex, however it is nonetheless readily derived from FIG. 15.

Error Feed-Back Modulators Implementation with Sum-of-Products Structures

Similar to serial implementations of DSP filters, serial implementations of Error Feed-Back Modulators are limited by the maximum feasible clock rate of the DSP block.

Assuming that the desired $STF_{EFM}(z)$ is given by Equation 8, FIG. 16 shows a practical serial implementation of an EFM using an SOP structure with CSD/CSA/CPA techniques. Note that even though $STF_{EFM}(z)$ takes the form of an FIR filter, Equation 8 uses the $A_{0,i}$ notation of an IIR filter (not the $B_{0,i}$ notation of an FIR filter) to emphasize the fact that the actual EFM implementation places the SOP structure in a feed-back loop.

$$STF_{EFM} = 1 + G_{EFM}(z) \qquad \text{Equation 8}$$

$$= 1 + \sum_{i=1}^{N} A_{0,i} \cdot z^{-i}$$

$$= 1 + z^{-1} \cdot \sum_{i=1}^{N} A_{0,i} \cdot z^{-(i-1)}$$

Comparing FIG. 16 to FIG. 6, the filter $G_{EFM}(z)$ 620 is implemented as an SOP structure with the delay operators 1621, the CSD multiplication operators 1622, the CSA adder 1630 (which also takes the input XEFM as an input) and the CPA adder 1635. The output from the CPA is separated into integer and fractional portions with the MSB/LSB operators 1640 and 1650, and the integer portion is used as the output $Y_{EFM}$ while the fractional portion (the error) is fed back into the filter.

Notice that the critical path in this EFM goes through the CSD and CSA (both fast) and the CPA (slow). So long as the CPA is in the critical path, it will tend to limit the maximum clock speed (and therefore the throughput) of the structure. Unfortunately, the nonlinear MSB/LSB operators follow the CPA and are neither commutative nor distributive, so it is impossible to remove the CPA from the critical path as was done in FIG. 12. There has been some research done on structures where the MSB/LSB operators are applied to the redundant CSA outputs and the redundant signal is fed back (removing the CPA from the critical path and increasing throughput) however this modification tends to reduce the performance of the EFM significantly, and furthermore circuit-level optimizations within the CSD and CSA structures can easily change the EFM's characteristics in unpredictable ways. As a result, these structures have found limited use.

Similar to DSP filters, parallelization can be applied to EFM's in an attempt to improve their throughput. FIG. 17, drawn in a style similar to FIG. 14, shows a naïve approach to creating a 2-wide parallel (i.e. P=2) version of FIG. 16, which is also similar to the parallel quantization noise shaper used as part of U.S. Pat. No. 7,873,227. The input to the P=2 EFM consists of the 2-wide block $X_{EFM}$ and $X_{EFM} \cdot z^{-1}$ and the output is the 2-wide block $Y_{EFM}$ and $Y_{EFM} \cdot z^{-1}$. CSD elements 1622 and CSA 1630 are merged to create the two identical merged CSD/CSA structures 1730 and 1731, and the single-sample $z^{-1}$ delay elements 1621 are replaced with double-sample $z^{-2}$ delay elements 1721. As with the serial EFM structure the parallel EFM structure requires the CPA 1635 to be in the critical path.

As with the naïve parallel IIR filter, this parallel EFM's throughput is limited by the need to evaluate multiple arithmetic blocks (in this case the CSD/CSA/CPA) in series: the output from the merged CSD/CSA operator 1730 is fed (through CPA and LSB operators) into the merged CSD/CSA structure 1731 without any delay element. As a result, the throughput of this 2-wide parallel EFM is, to a first order, limited to approximately the same throughput as an equivalent serial EFM. This is similar to the naïve parallel IIR filter, however because the EFM requires the CPA operator to be evaluated for every output sample, the parallel EFM will tend to have lower throughput than the equivalent parallel IIR. This is at least partially offset by the fact that the EFM only requires evaluation of the LSB's in each CPA, which will in most situations be faster than evaluating the full CPA in an IIR.

As with the serial EFM, attempts to "unroll" the parallel EFM to create an equivalent structure to FIG. 15 are frustrated by the nonlinear MSB/LSB operators that force all CPA's to be evaluated in series and make it essentially impossible to compute previous error feedback values in parallel using a recurrence relation similar to Equation 7. One possible approach, similar to one used in parallel Decision Feed-Back Equalizers, involves parallel speculative pre-computation of previous error feed-back values followed by a final selection stage, however the complexity cost of this approach grows exponentially with the block size P, limiting it to only very small block sizes. For extremely high throughput EFMs where the block size is large (for example P=8 with a clock rate of 1 GHz for 8 Gsps throughput) this becomes impractical.

Therefore, improvements in noise shaping devices to enable high throughput are desirable.

SUMMARY

In a first aspect, the present disclosure provides a quantization noise-shaping device that comprises: a first feed-forward filter having a first transfer function, the first feed-forward filter to receive an input digital signal and to output a first filtered digital signal, the first filtered digital signal being a function of the first transfer function; a quantizer to receive the first filtered signal and to output a quantizer output signal, the quantizer output signal having a lower amplitude resolution than that of the first filtered signal; and a second feed-forward filter having a second transfer function, the second feed-forward filter to receive the quantizer output signal and to output a second filtered digital signal, the second filtered digital signal being a function of the quantizer output signal and of the second transfer function. The quantization noise-shaping device having a target noise transfer function and the second feed-forward filter is configured to have the second transfer function equal to the target noise transfer function. Further, the first feed-forward filter is configured to have the first transfer function substantially equal to one over the second transfer function.

In a second aspect, the present disclosure provides a multi-bit digital-to-analog system that comprises a quantization noise-shaping device having; a first feed-forward filter having a first transfer function, the first feed-forward filter to receive an input digital signal and to output a first filtered digital signal, the first filtered digital signal being a function of the first transfer function; a quantizer to receive the first filtered signal and to output a quantizer output signal, the quantizer output signal having a lower amplitude resolution than that of the first filtered signal; and a second feed-forward filter having a second transfer function, the second feed-forward filter to receive the quantizer output signal and to output a second filtered digital signal, the second filtered digital signal being a function of the quantizer output signal and of the second transfer function. The noise-shaping device has a target noise transfer function and the second feed-forward filter is configured to have the second transfer function equal to the target noise transfer function. The first feed-forward filter is configured to have the first transfer function substantially equal to one over the second transfer function. The multi-bit digital-to-analog system further comprises a digital-to-analog converter operationally connected to the quantization noise-shaping device. The DAC is to receive a quantization noise-shaping device output signal and to convert the quantization noise-shaping device output signal into a discrete time analog signal.

"The first feed-forward filter being configured to have the first transfer function substantially equal to one over the second transfer function" is to be understood as meaning that the first transfer function is equal to one over the second transfer function when the second transfer function has nulls (zero values) in the signal band or, when the first transfer function does not have finite gain values over all the frequencies of the signal band. When the second transfer function does not have nulls and the first transfer function has finite gain values over all frequencies in a signal band, then, the expression "The first feed-forward filter being configured to have the first transfer function substantially equal to one over the second transfer function" is to be understood as meaning the first transfer function can be approximately equal to one over the second transfer function over the signal band to an accuracy determined by the required signal band frequency response required by the chosen application.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a Quantization Noise-Shaping (QNS) structure, capable of operating with high clock rates and optionally with large parallelization factors to produce extremely high throughput. The description that follows describes this QNS structure as part of a Digital-to-Analog Converter (DAC) system, however the QNS structure has applicability in several other areas, including, for example, Fractional-N frequency synthesis.

Cascaded-Integrator-Comb (CIC) QNS Structure

Figure 1:
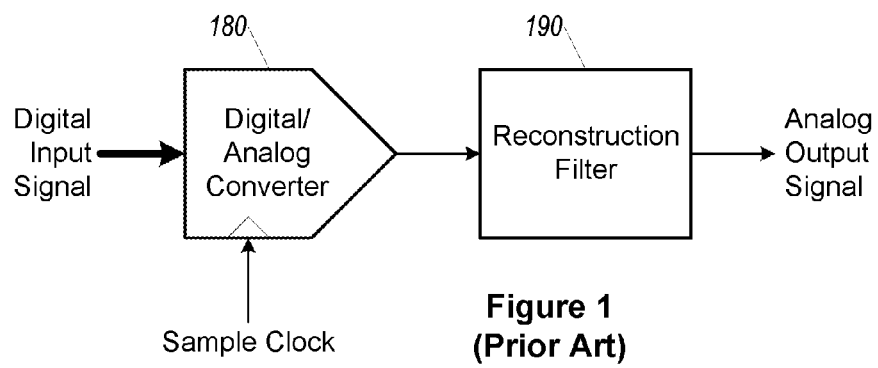
FIG. 1 shows a block diagram of a generic DAC system.
Figure 2:
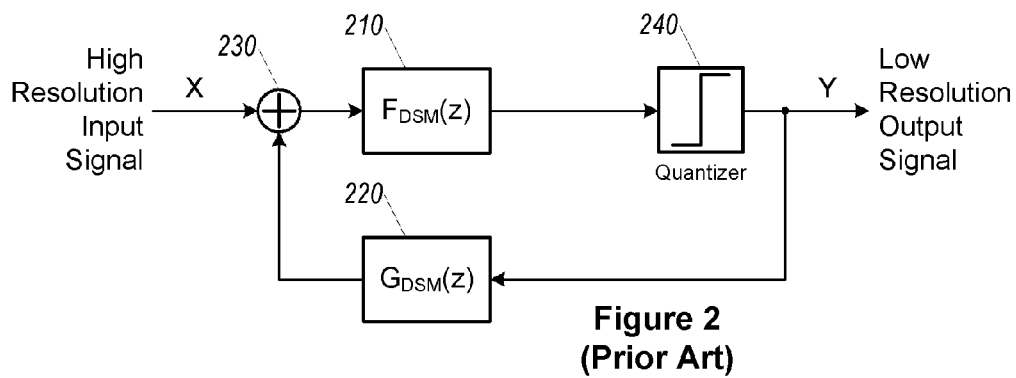
FIG. 2 shows a block diagram of a DSM.
Figure 3:
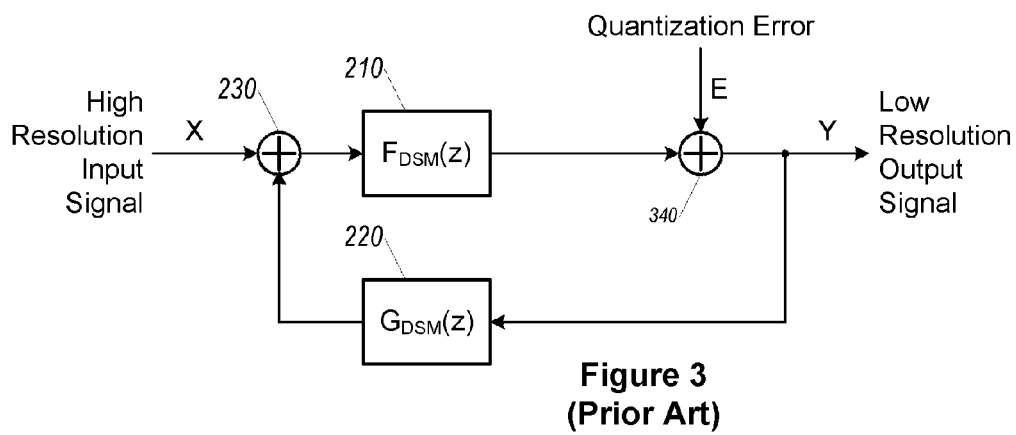
FIG. 3 shows a small-signal model of the DSM of FIG. 2 where the quantizer is replaced by an adder receiving a uniform quantization error.
Figure 4:
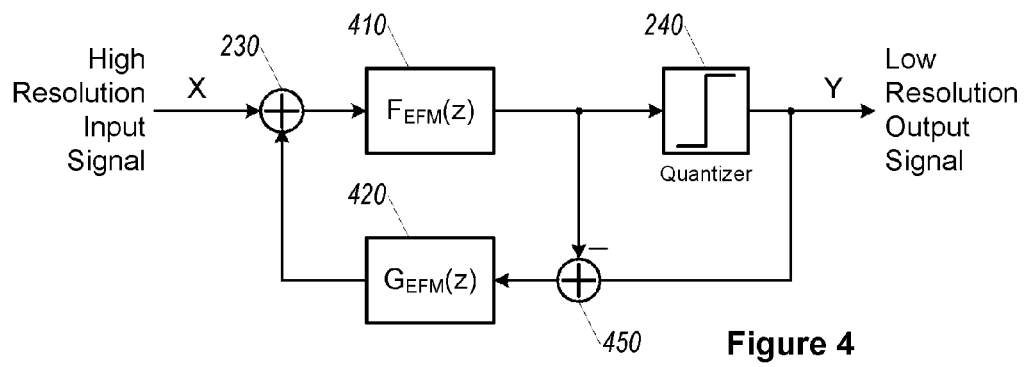
FIG. 4 shows a block diagram of an EFM.
Figure 5:
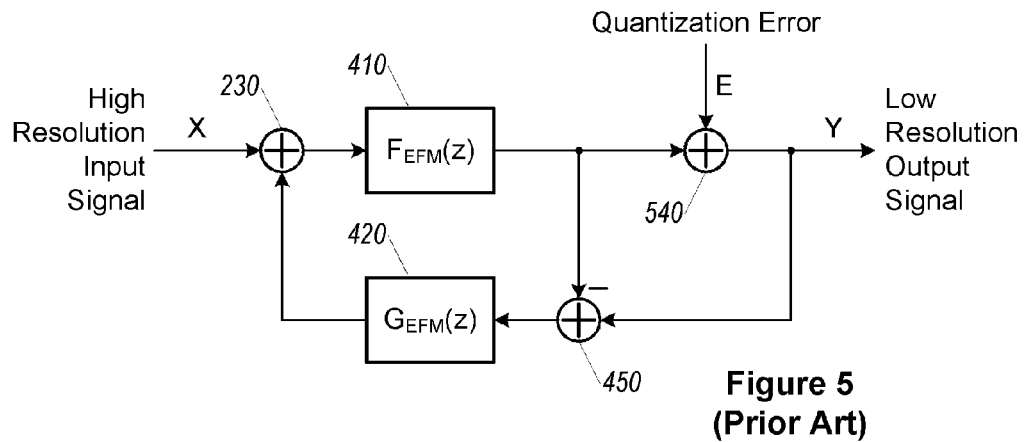
FIG. 5 shows a small-signal model of the EFM of FIG. 4 where the quantizer is replaced by an adder receiving a uniform quantization error.
Figure 18:
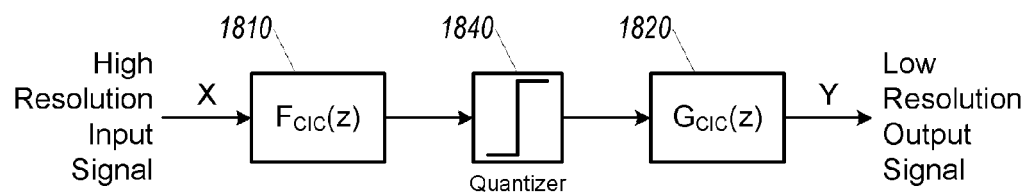
FIG. 18 shows a block diagram of a Cascaded Integrator-Comb (CIC) QNS device in accordance with the present disclosure.
Figure 19:
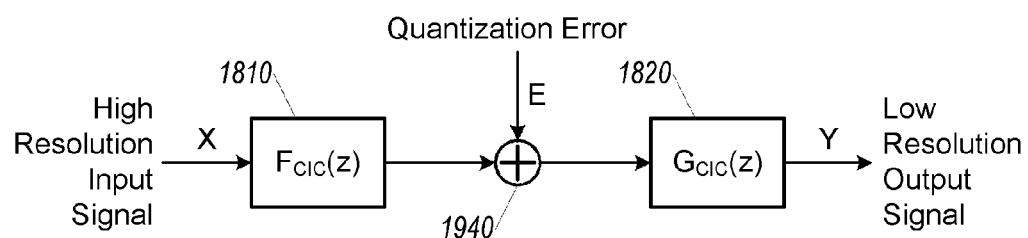
FIG. 19 shows a small-signal model of the CIC QNS device of FIG. 18 where the quantizer is replaced by an adder receiving a uniform quantization error.

FIG. 18 shows a block diagram of a CIC QNS system, which differs significantly from both the Delta-Sigma Modulator (DSM) and Error Feedback Modulator (EFM) systems discussed in FIG. 2 and FIG. 4 in that the feedback paths and corresponding feed-back filters $G_{DSM}(z)$ and $G_{EFM}(z)$ that are present in both the DSM system and the EFM system are completely removed. Instead, there are two feed-forward filters, $F_{CIC}(z)$ and $G_{CIC}(z)$ (1810 and 1820 respectively) that are placed at the input and output of the Quantizer 1840. Performing the same linearization transformation as was done in FIG. 3 and in FIG. 5 provides the small-signal model shown in FIG. 19 which has the Signal Transfer Function ($STF_{CIC}(z)$) and Noise Transfer Function ($NTF_{CIC}(z)$) given by Equation 9.

$$Y = F_{CIC}(z) \cdot G_{CIC}(z) \cdot X + G_{CIC}(z) \cdot E$$

$$= STF_{CIC}(z) \cdot X + NTF_{CIC}(z) \cdot E$$

$$STF_{CIC}(z) = F_{CIC}(z) \cdot G_{CIC}(z)$$

$$NTF_{CIC}(z) = G_{CIC}(z) \quad \text{Equation 9}$$

Figure 6:
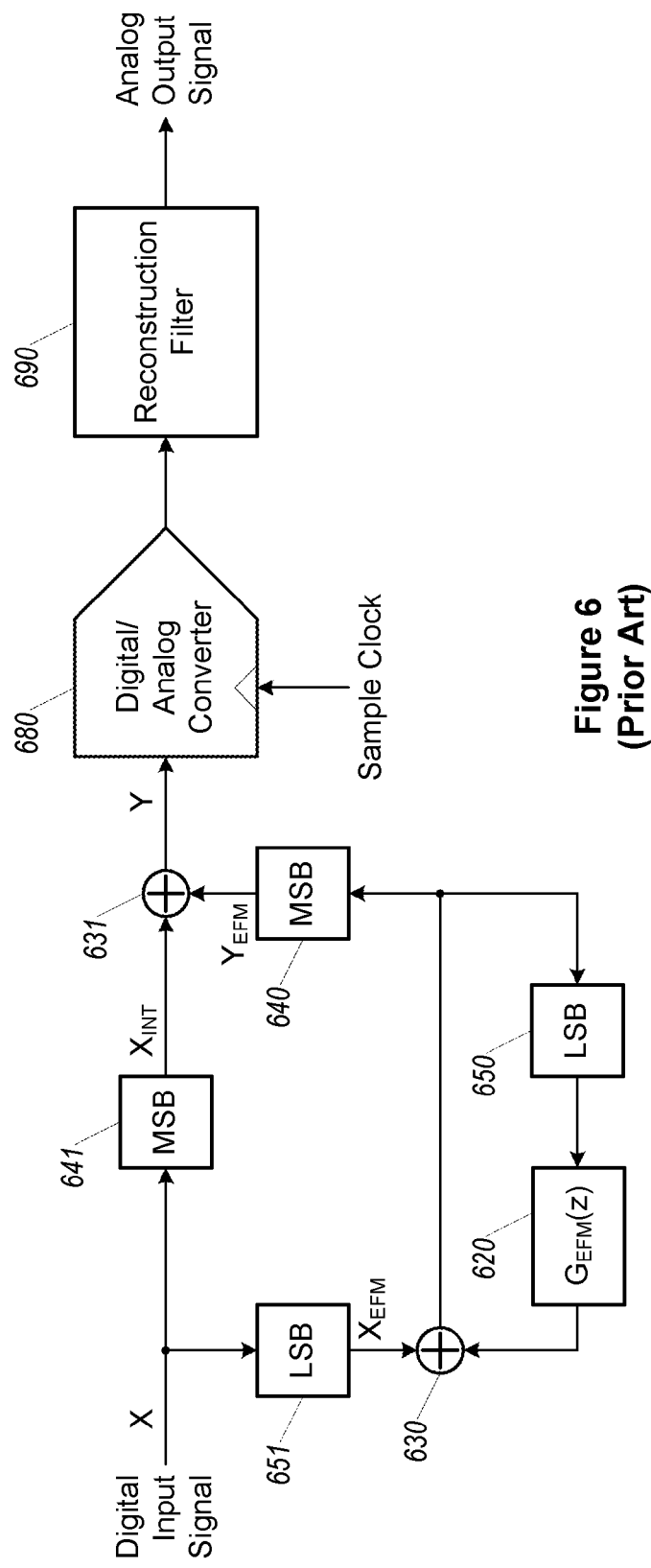
FIG. 6 shows a block diagram of an EFM DAC system.
Figure 7A:
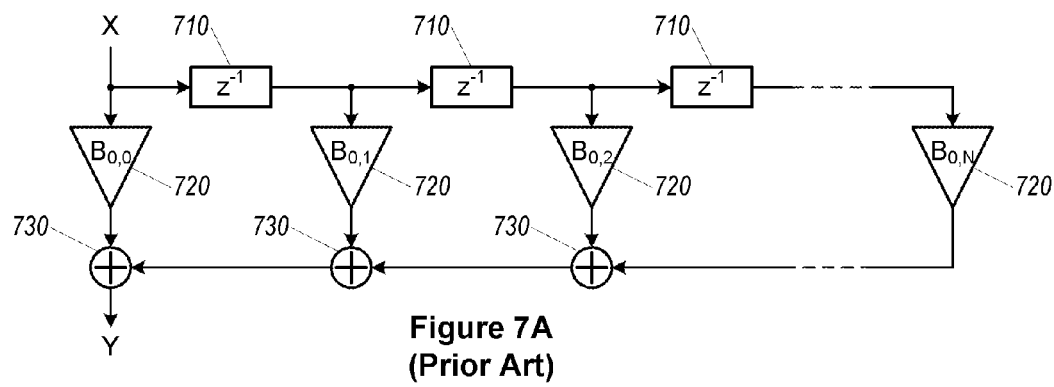
FIG. 7A shows a block diagram of a Sum of Products (SOP) DF-I FIR structure.
Figure 7B:
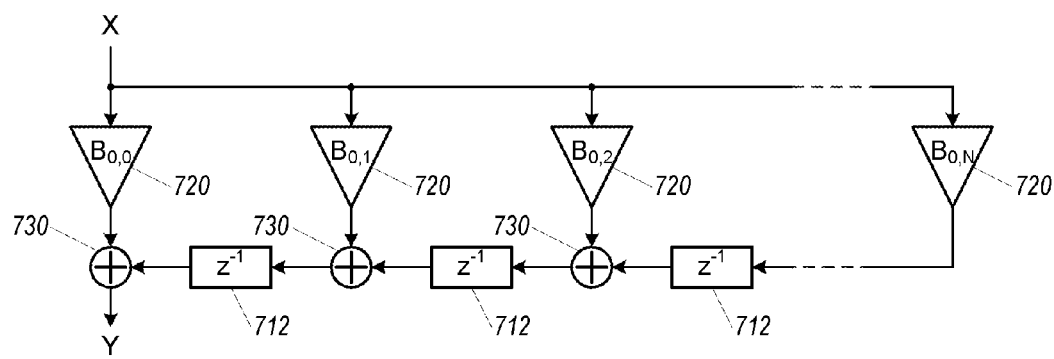
FIG. 7B shows a block diagram of a SOP DF-II FIR structure.
Figure 8A:
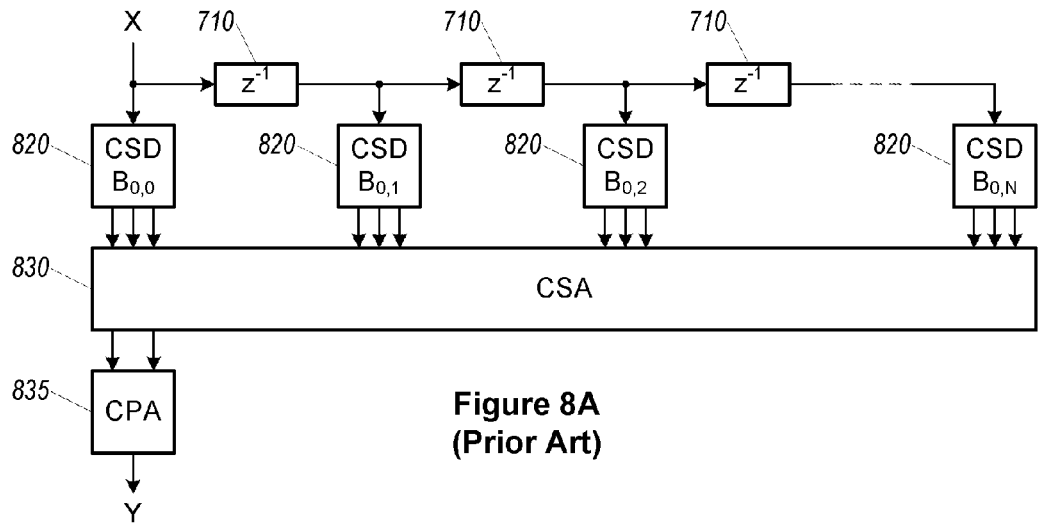
FIG. 8A shows a block diagram of a SOP DF-I FIR structure that uses CSD and CSA techniques, and a CPA.
Figure 8B:
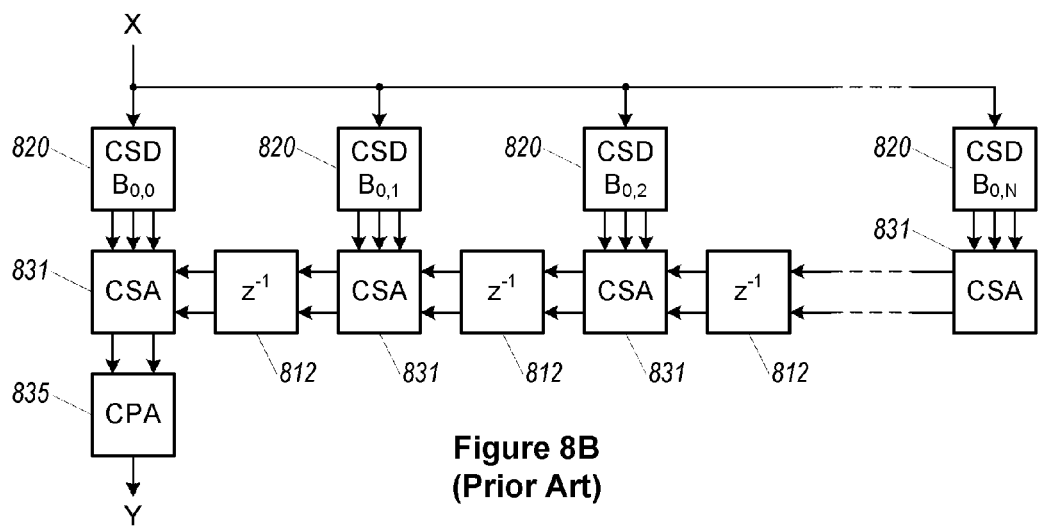
FIG. 8B shows a block diagram of a SOP DF-II FIR structure that uses CSD and CSA techniques, and a CPA.
Figure 9:
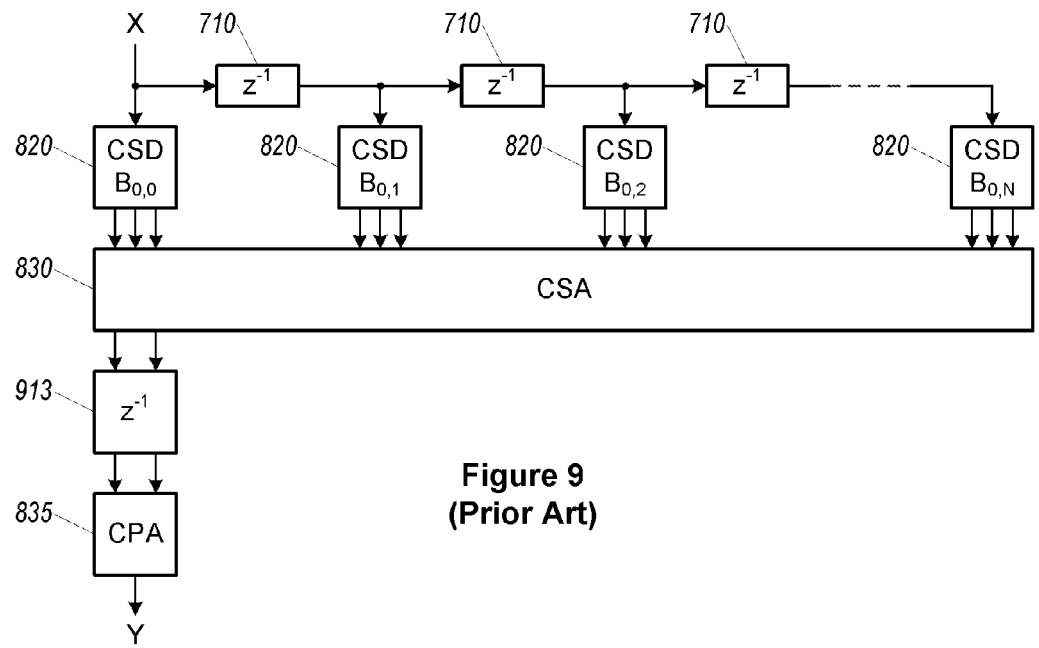
FIG. 9 shows the block diagram of FIG. 8A with a pipeline register added between the CSA and the CPA.
Figure 10:
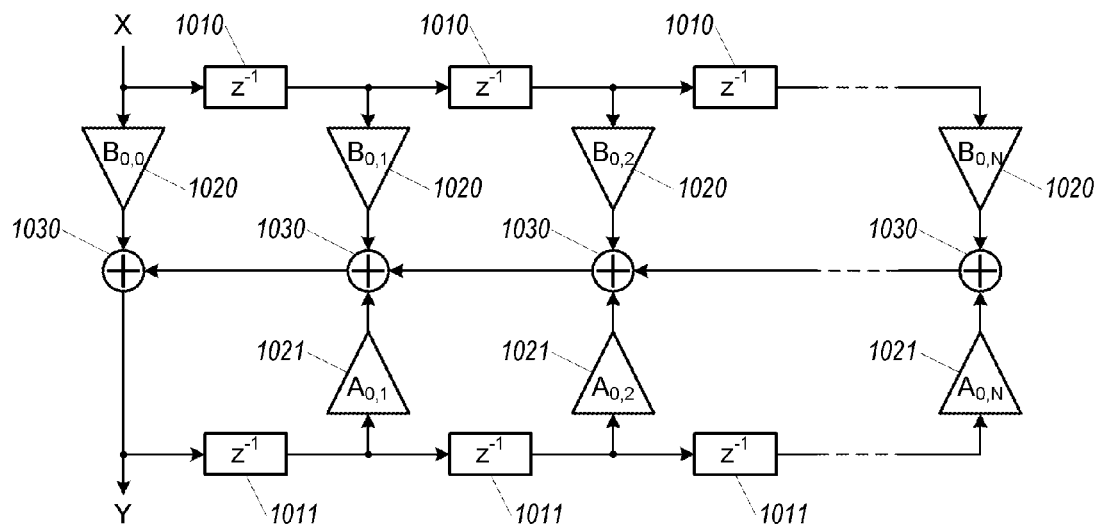
FIG. 10 shows a block diagram of an SOP DF-I IIR filter.
Figure 11:
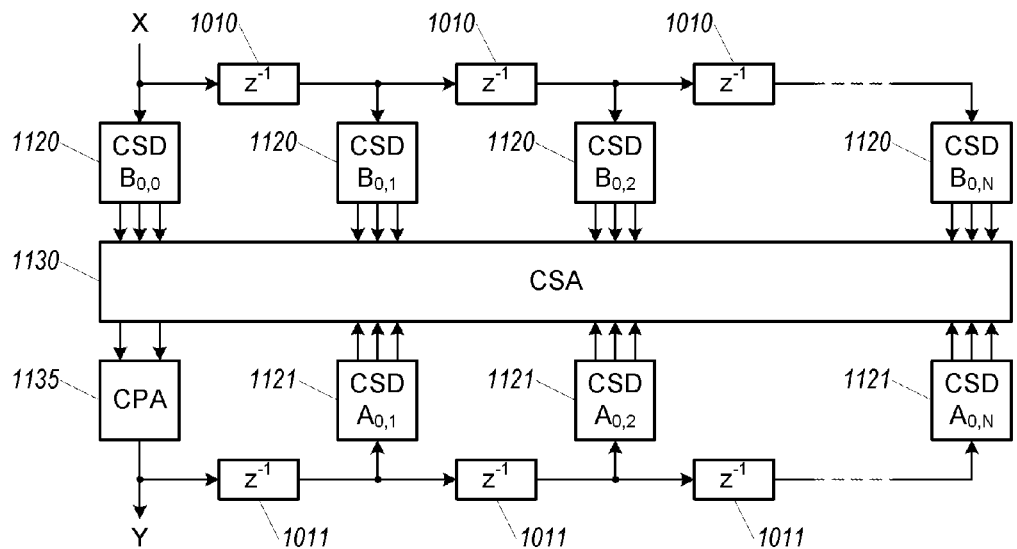
FIG. 11 shows a block diagram of a SOP DF-I IIR filter implemented using CSD and CSA techniques.
Figure 20:
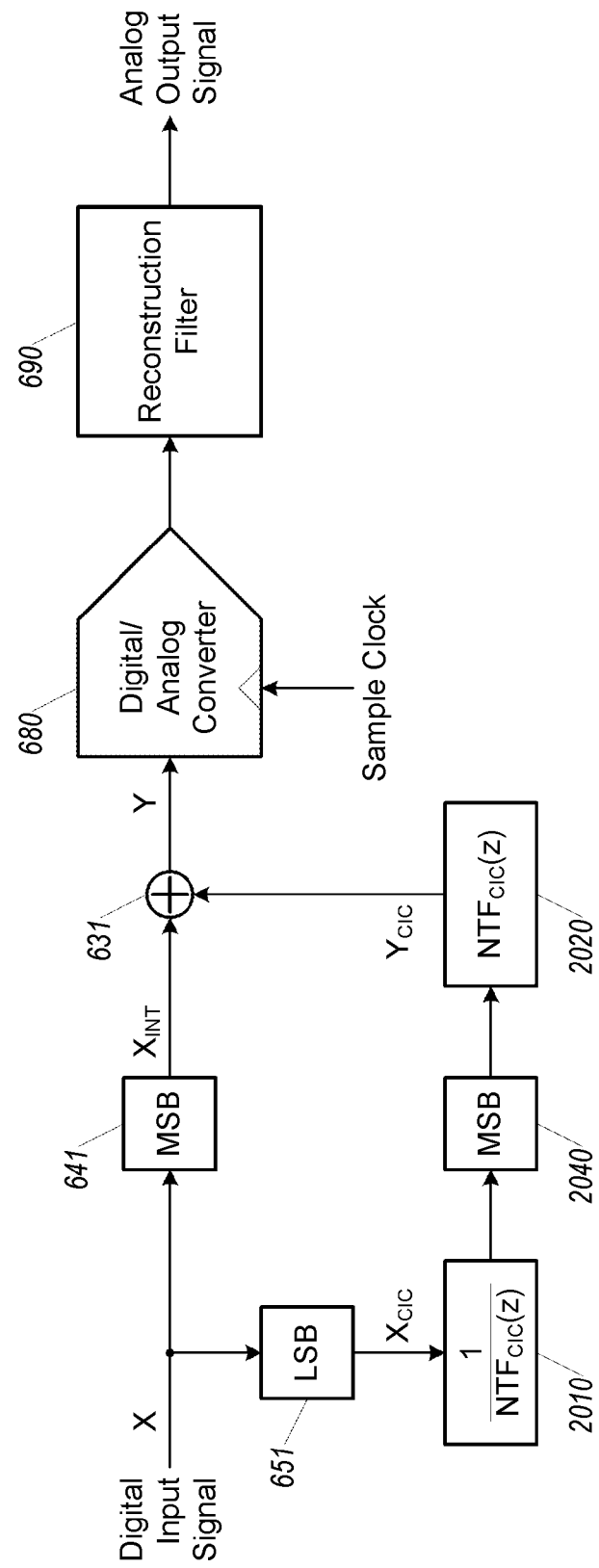
FIG. 20 shows a multi-bit digital to analog system in accordance with the present disclosure.

Examining Equation 9, it is clear that if $G_{CIC}(z)$ chosen to be equal to the desired $NTF_{CIC}(z)$ and if $F_{CIC}(z)$ is chosen to be its inverse $1/NTF_{CIC}(z)$, $STF_{CIC}(z)$ will be unity. Taking this, and applying it to the Multi-Bit DAC system of FIG. 6 produces the structure shown in FIG. 20. The feed-forward filters $1/NTF_{CIC}(z)$ and $NTF_{CIC}(z)$ appear as items 2010 and 2020 respectively, bracketing the nonlinear quantization Most Significant Bit (MSB) operator 2040. As before, in order to limit the bit widths through the QNS structure, the additional MSB and Least Significant Bit (LSB) operators 641 and 651 and final addition operator 631 are used.

In order to function correctly, there can be two constraints on $NTF_{CIC}(z)$. Firstly, $NTF_{CIC}(z)$ must have a finite gain over all frequencies in order not to cause overflow at $Y_{CIC}$. Secondly, all coefficients in $NTF_{CIC}(z)$ must be integers in order to prevent fractional bit regrowth at $Y_{CIC}$. These two constraints taken together mean that for most applications $NTF_{CIC}(z)$ will have no Infinite Impulse Response (IIR) coefficients ($A_{j,i}$), which in turn means that $1/NTF_{CIC}(z)$ will have no Finite Impulse Response (FIR) coefficients ($B_{j,i}$). These constraints are significant, but still provide for a large number of possible choices of $NTF_{CIC}(z)$. One important point to be made is that this structure would tend only to be used for applications where extremely high throughput and comparatively low Oversample Ratio (OSR) are required, and $NTF_{CIC}(z)$ for these applications tend to readily fit these constraints.

Figure 21:
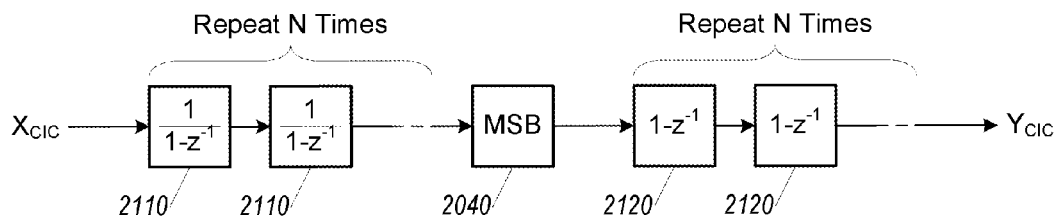
FIG. 21 shows a block diagram of a CIC QNS device implemented as a cascade of integrators and differentiators, in accordance with the present disclosure.

One important class of $NTF_{CIC}(z)$ that fits these constraints takes the form $(1-z^{-1})^N$. These $NTF_{CIC}(z)$'s place N zeros at DC, maximizing the Signal-to-Quantization Noise Ratio (SQNR) for low frequencies. When implementing a CIC QNS structure with this $NTF_{CIC}(z)$ we can build the structure in FIG. 21, which consists of a first cascade of N integrator elements 2110, the MSB operator 2040, and a second cascade of N differentiator elements 2120.

Figure 22A:
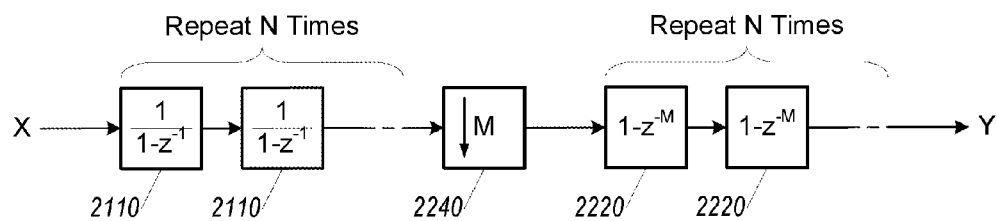
FIG. 22A shows a block diagram of a Hogenauer CIC decimation filter.
Figure 22B:
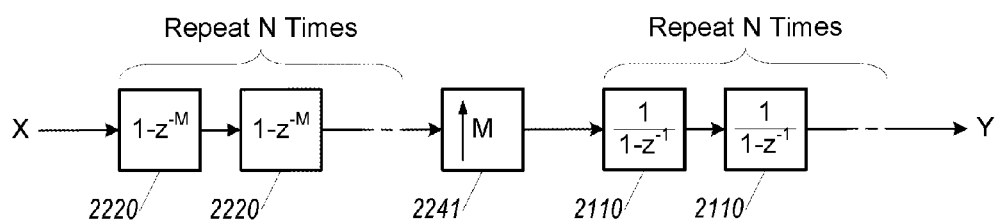
FIG. 22B shows a block diagram of a Hogenauer CIC interpolation filter.

The form that this structure takes is similar to the CIC decimation filter, also known as a "Hogenauer Decimation Filter", shown in FIG. 22A. In a CIC decimation filter, a cascade of integrators 2110 which implements the transfer function $1/(1-z^{-1})^N$ is followed by a down-sample-by-M operator 2240, followed by a cascade of differentiators 2220 (running at a lower rate) which implements the transfer function $(1-z^{-M})^N$. The poles of the integrator cascade are all at DC, and are cancelled by the zeros of the decimator cascade which are also all at DC even though the integrator and decimator cascades are running at different clock rates. The dual of the CIC decimation filter is the CIC interpolation filter in FIG. 22B, which swaps the location of the integrator cascades 2110 and differentiator cascades 2220, and uses an up-sample-by-M operator 2241. Because of the similarity between our new QNS structure and the CIC Decimation filter we are describing our structure as a CIC QNS structure.

Both CIC decimation and interpolation filters find wide use in a large number of applications because they are extremely hardware efficient. Both the integrators and differentiators can be built using simple arithmetic operators with wrap-around (modulo) arithmetic, which means that the digital bus widths within the filter may be sized based only on the output bus width and no special consideration for maximum internal signal levels needs to be made. This is particularly important because the integrators, having infinite gain at DC, would otherwise require infinite bus widths. In addition, the integrators, differentiators, and up-conversion/down-conversion operators can be easily implemented using Carry Save Arithmetic (CSA) techniques, and both accept and produce redundant signals, allowing an entire CIC interpolation/decimation filter to be implemented with redundant internal signals, requiring only a single Carry Propagate Adder (CPA) operator at the output.

Figure 23:
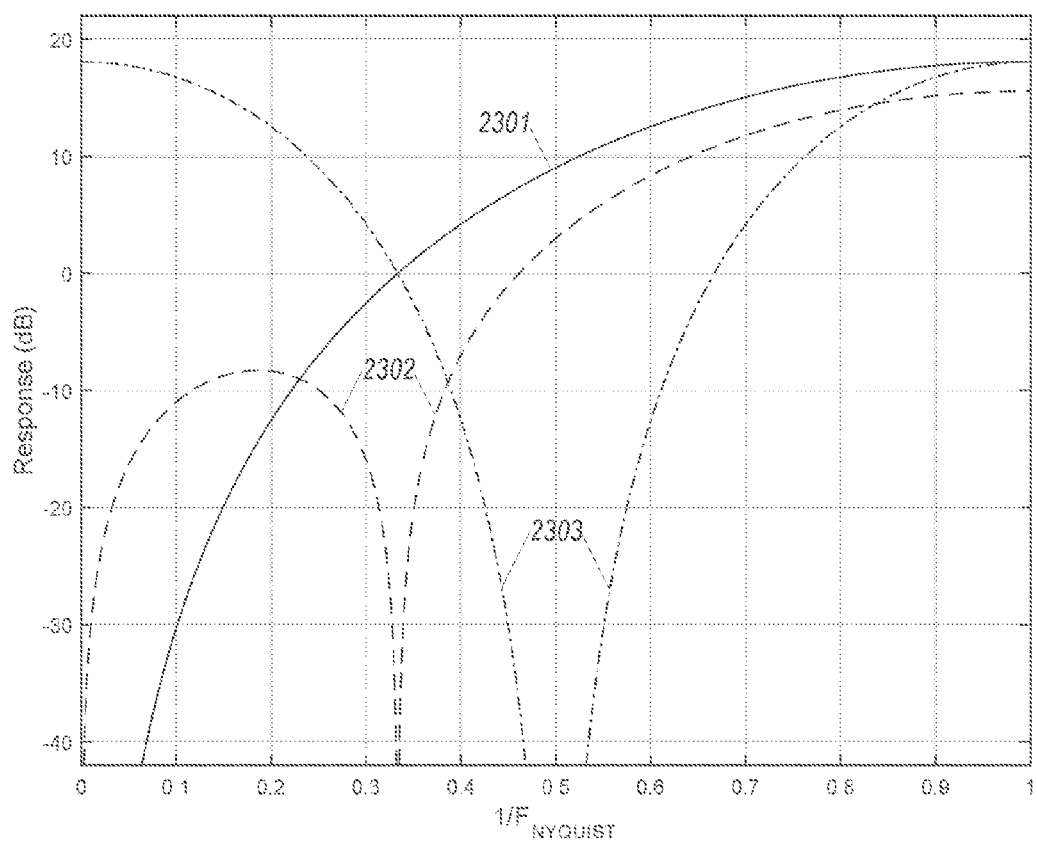
FIG. 23 shows frequency responses for three different CIC QNS devices, in accordance with the present disclosure.

Even though there are strong similarities between the CIC Decimation filter and the CIC QNS structure, there is a fundamental difference: in order to have pole/zero cancellation, the CIC Decimation filter's integrator cascade response must be $1/(1-z^{-1})^N$, whereas the CIC QNS structure's integrator cascade does not, allowing the system designer to choose other $NTF_{CIC}(z)$'s to suit their target application. Three different example $NTF_{CIC}(z)$ filter responses are shown in FIG. 23. In a first plot 2301, $NTF_{CIC}(z) = (1-z^{-1})^3 = (1 - 3 \cdot z^{-1} + 3 \cdot z^{-2} - z^{-3})$ suppresses QN below $0.33 \cdot F_{NYQUIST}$. In a second plot 2302, $NTF_{CIC}(z) = (1 - 2 \cdot z^{-1} + 2 \cdot z^{-1} - z^{-3})$ suppresses QN below $0.46 \cdot F_{NYQUIST}$. In a third plot 2303, which relates to a band-pass scenario, $NTF_{CIC}(z) = (1 + 3 \cdot z^{-2} + 3 \cdot z^{-4} + z^{-6})$ suppresses QN over $[0.33, 0.67] \cdot F_{NYQUIST}$.

No matter which form is used as the $NTF_{CIC}(z)$, the CIC QNS structure also shares the property of CIC filters in that it can be implemented with modulo arithmetic, which significantly reduces the implementation cost. In fact, because many practical $1/\text{NTF}_{CIC}(z)$ choices involve integrators that have infinite gain at certain frequencies that would cause overflow, modulo arithmetic implementations are a requirement.

For applications where $\text{NTF}_{CIC}(z)$ does not have nulls (zero values) in the signal band, $F_{CIC}(z)$ can instead be approximately equal to (or substantially equal to) $1/\text{NTF}_{CIC}(z)$ over the signal band. In this case, $F_{CIC}(z)$ must have finite gain across all frequencies, and how well it must match $1/\text{NTF}_{CIC}(z)$ is determined by the application and by frequency response of $\text{STF}_{CIC}(z)=F_{CIC}(z)\cdot\text{NTF}_{CIC}(z)$.

Implementation of CIC QNS

Figure 12:
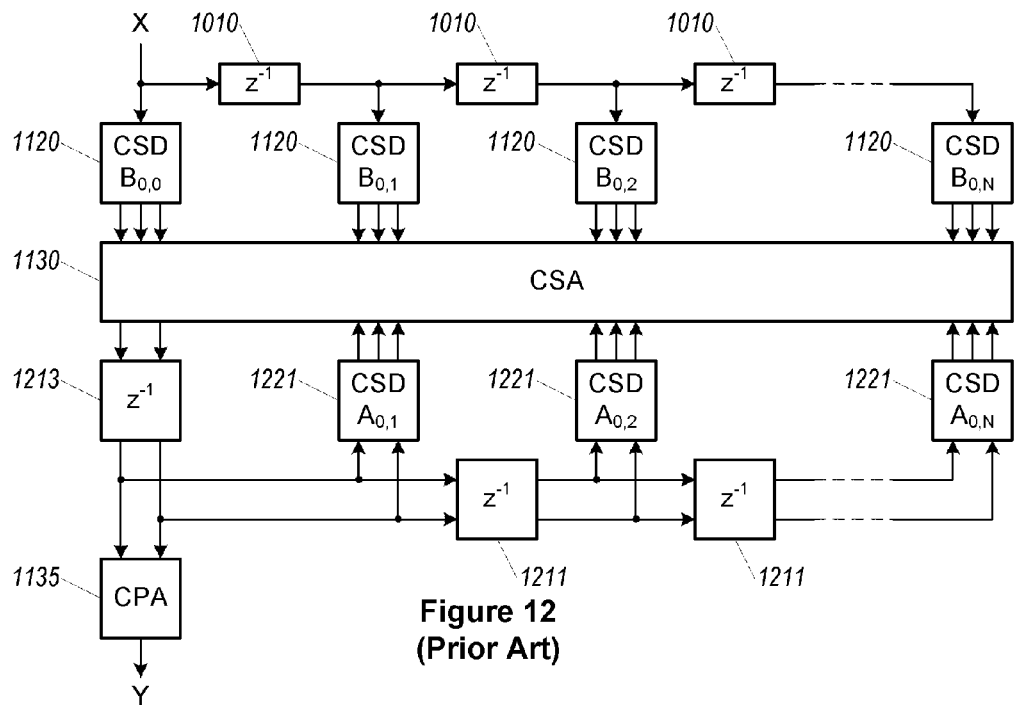
FIG. 12 shows a block diagram of FIG. 11 but with a pipeline register added between the CSA and the CPA.
Figure 13:
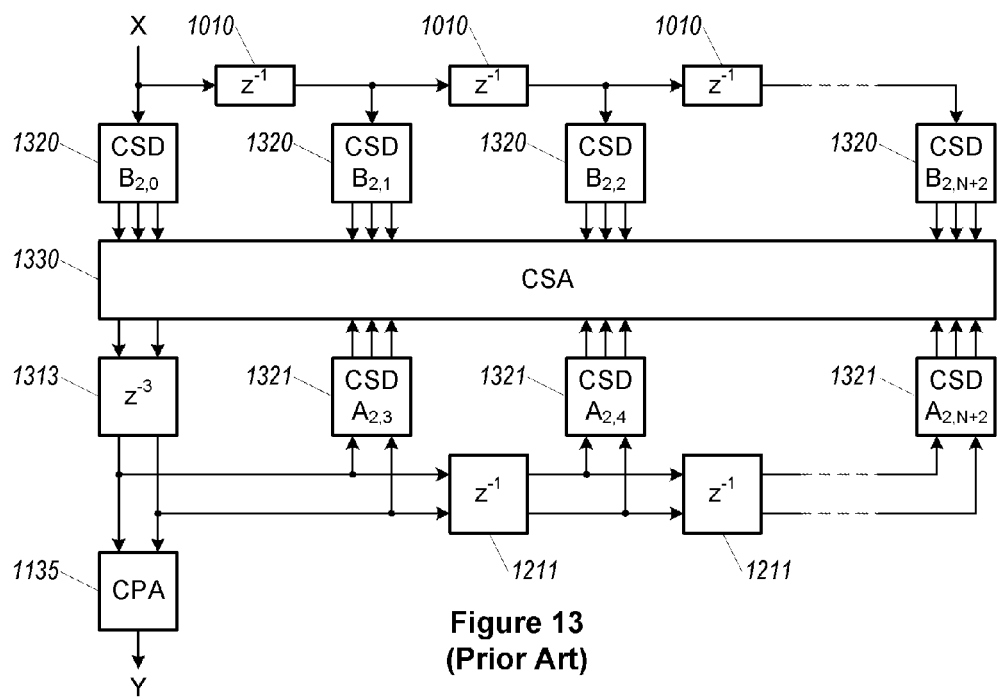
FIG. 13 shows a block diagram of unrolled SOP DF-I IIR filter structure.
Figure 14:
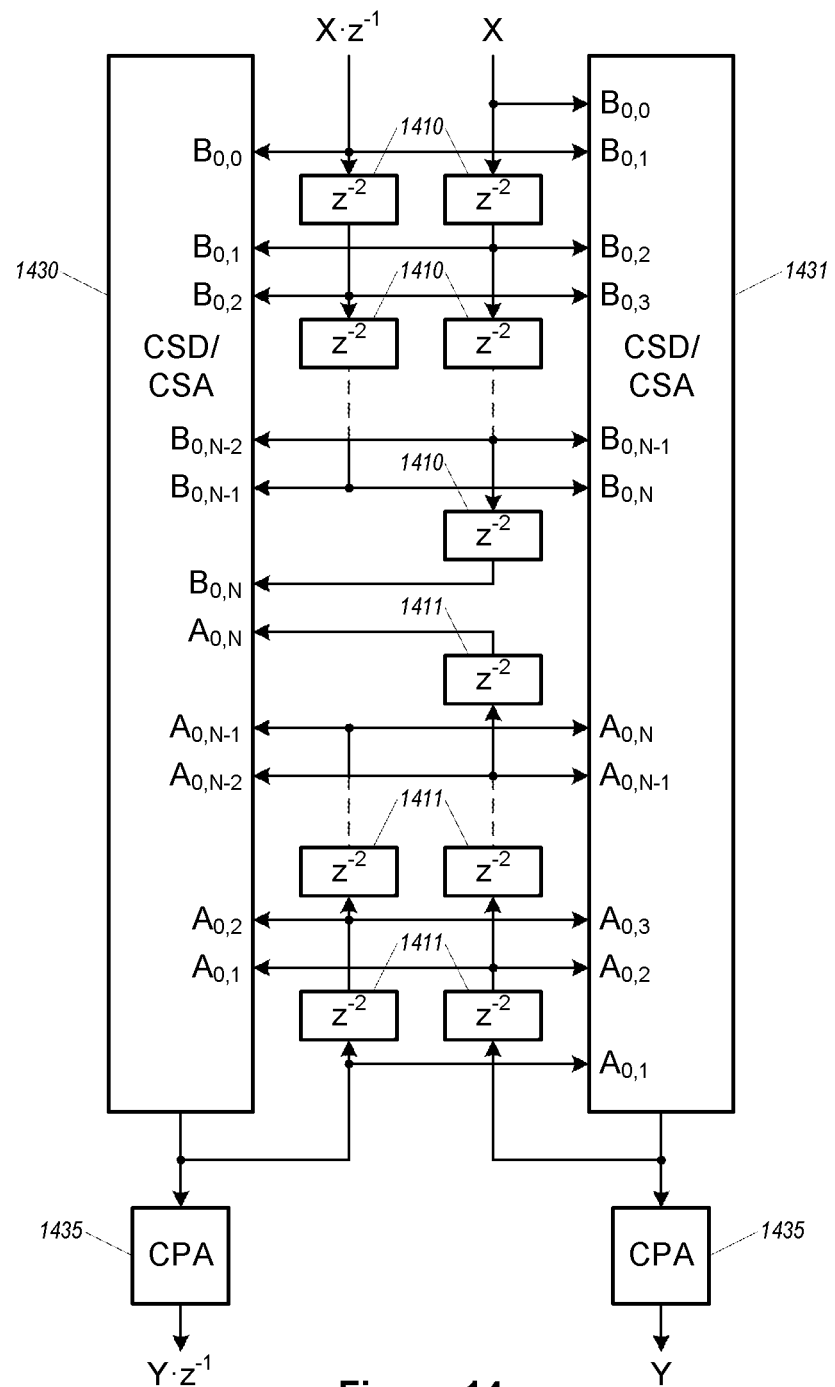
FIG. 14 shows a block diagram of parallel implementation of FIG. 12.

The complexity of a CIC QNS is significantly larger than for an equivalent EFM. The single feedback filter 620 (shown in FIG. 6) has been replaced by the two feed-forward filters 2010 and 2020 (shown in FIG. 20). For low-throughput applications where serial operation with the CPA in the critical path is possible, this additional complexity means that the EFM would be preferred over a CIC QNS. However for high-throughput applications where serial operation with the CPA in the critical path or applications where parallel operation is necessary the CIC QNS becomes preferable. Because neither feed-forward filters $1/\text{NTF}_{CIC}(z)$ nor $\text{NTF}_{CIC}(z)$ (2010 or 2020) have the MSB operator nonlinearity 2040 contained within them, both may be readily implemented either using efficient serial Sum of Products (SOP) structures similar to FIG. 12 or FIG. 13 or as efficient parallel SOP structures using Equation 7 and FIG. 15.

Figure 24:
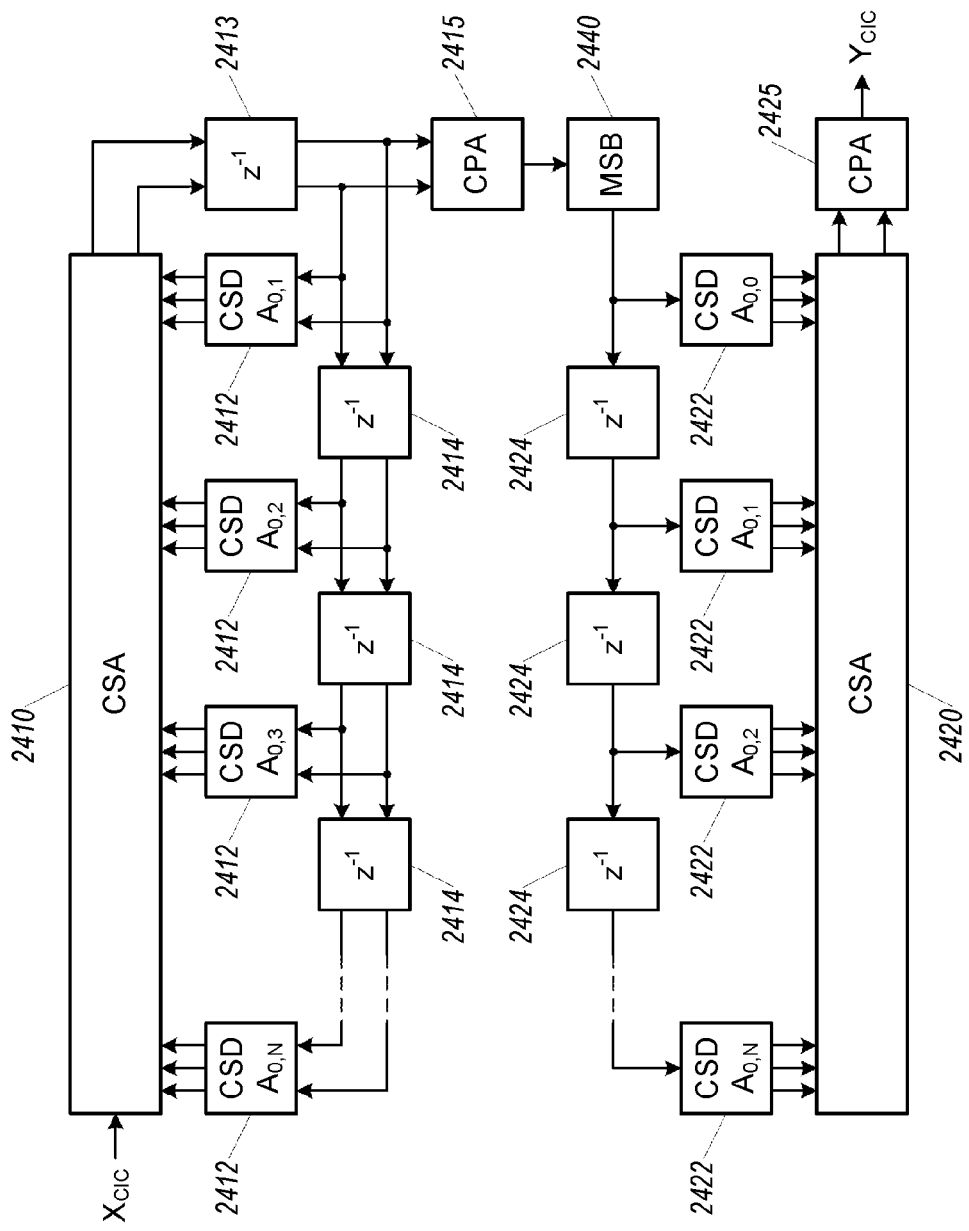
FIG. 24 shows an example of a serial implementation of a CIC QNS device, in accordance with the present disclosure.

FIG. 24 shows a serial implementation of a CIC QNS structure with the input $X_{CIC}$ and the output $Y_{CIC}$. The Canonical Signed Digit (CSD) blocks 2412 and CSA block 2410, together with the delay elements 2414 implement an efficient SOP IIR filter $1/\text{NTF}_{CIC}(z)$. Delay element 2413 forms part of the feedback delay and also allows time for blocks 2410 and 2412 to evaluate. The CPA block 2415 combines the redundant output from 2410, and then the MSB operator 2440 performs the quantization operation. The CSD blocks 2422 and CSA block 2420, together with the delay elements 2424 and CPA 2425 implement an efficient SOP FIR filter $\text{NTF}_{CIC}(z)$ to produce the final output $Y_{CIC}$. Both CPA's 2415 and 2425 are placed outside the feedback loop and can be readily pipelined in order to meet timing for the desired throughput. If the IIR portion of the structure does not meet timing, the function $1/\text{NTF}_{CIC}(z)$ may be unrolled one or more times using Equation 7 and blocks 2410 and 2412 may be adjusted appropriately. If the FIR portion of the structure does not meet timing, additional pipeline registers may be added without requiring Equation 7. The CSD/CSA functions can take advantage of modulo arithmetic in order to reduce area, power, and complexity.

Figure 25:
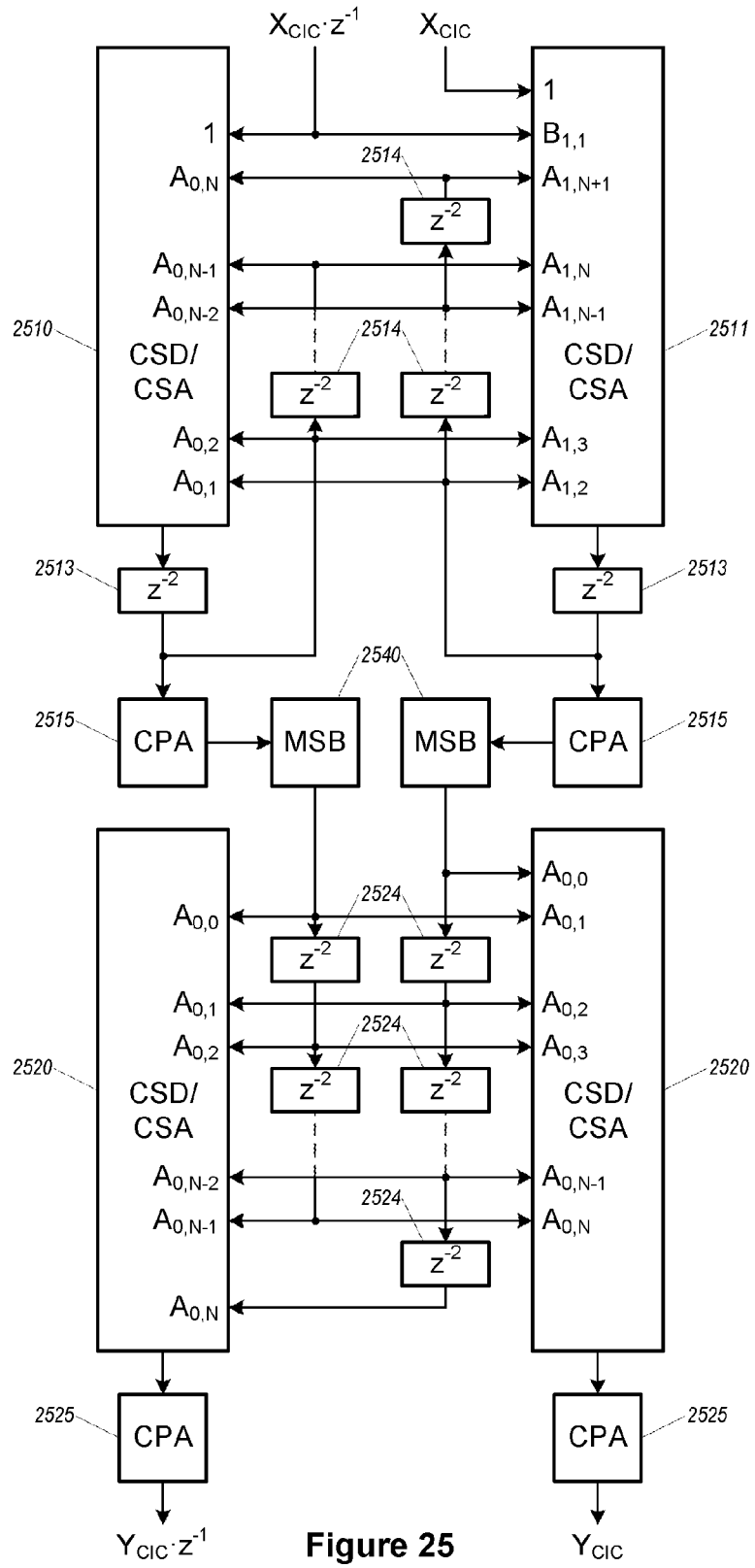
FIG. 25 shows an example of a parallel implementation of a CIC QNS device, in accordance with the present disclosure.

FIG. 25 shows a P=2 implementation of a parallel CIC QNS structure. The input to the structure of the 2-wide block $X_{CIC}$ and $X_{CIC}\cdot z^{-1}$ and the output is the 2-wide block $Y_{CIC}$ and $Y_{CIC}\cdot z^{-1}$. As with previous parallel figures, CSD/CSA operations are merged together into one block, with separate CPA operators. CSD/CSA blocks 2510 and 2511 implement the required SOP structures for $1/\text{NTF}_{CIC}(z)$. 2510 implements $1/\text{NTF}_{CIC}(z)$ directly, while 2511 implements $1/\text{NTF}_{CIC,1}(z)$, the once-unrolled version of $1/\text{NTF}_{CIC}(z)$. The SOP redundant outputs are fed back through appropriate delay registers 2513 and 2514, and are also combined with the two CPA operators 2515 to be fed into the MSB operators 2540. The quantized outputs are fed through appropriate feed-forward delay registers 2524 into the two identical CSD/CSA blocks 2520 that implement the SOP structure for $\text{NTF}_{CIC}(z)$. The final CPA operators 2525 combine the redundant SOP outputs to produce the final outputs from the block. If the IIR portion of the structure does not meet timing, Equation 7 can be applied to produce twice-unrolled (2510) and thrice-unrolled (2511) versions of $1/\text{NTF}_{CIC}(z)$. As with the serial structure, if the FIR portion of the structure does not meet timing, additional pipeline registers can be added without needing to unroll the function. As with a serial implementation, this parallel implementation can take advantage of modulo arithmetic in all stages in order to reduce area, power, and complexity.

Figure 15:
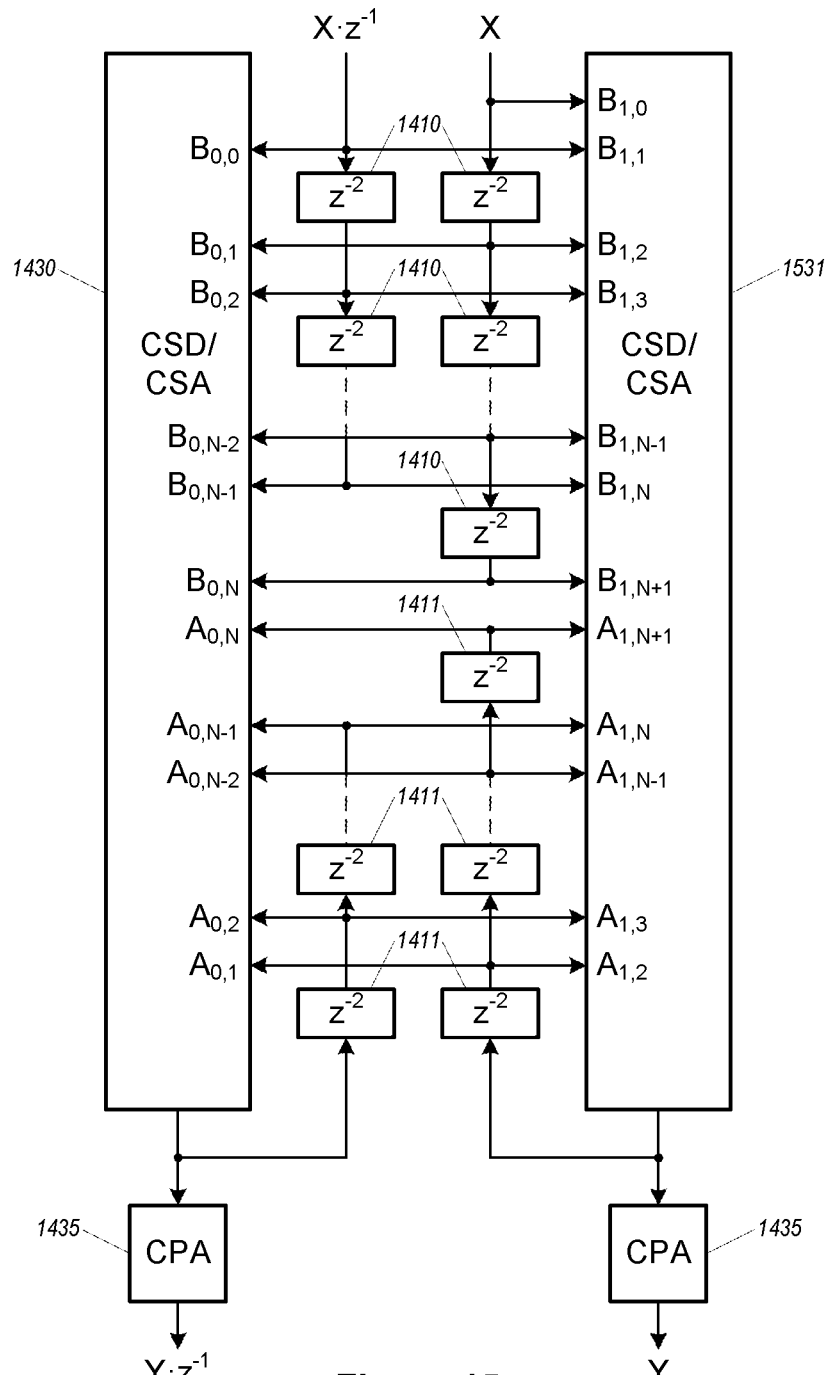
FIG. 15 shows a modified version of FIG. 14 where one CSD/CSA structure has been unrolled to implement $H_1(z)$ instead of $H_0(z)$, increasing throughput.
Figure 16:
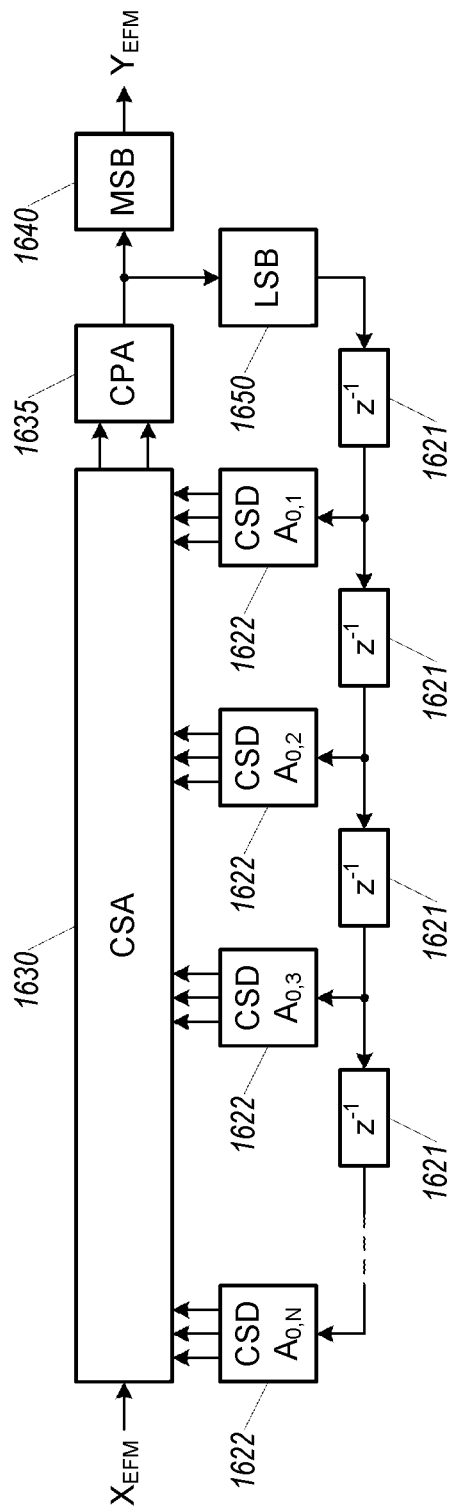
FIG. 16 shows a block diagram of a practical serial implementation of an EFM using CSD and CSA techniques and a CPA.
Figure 17:
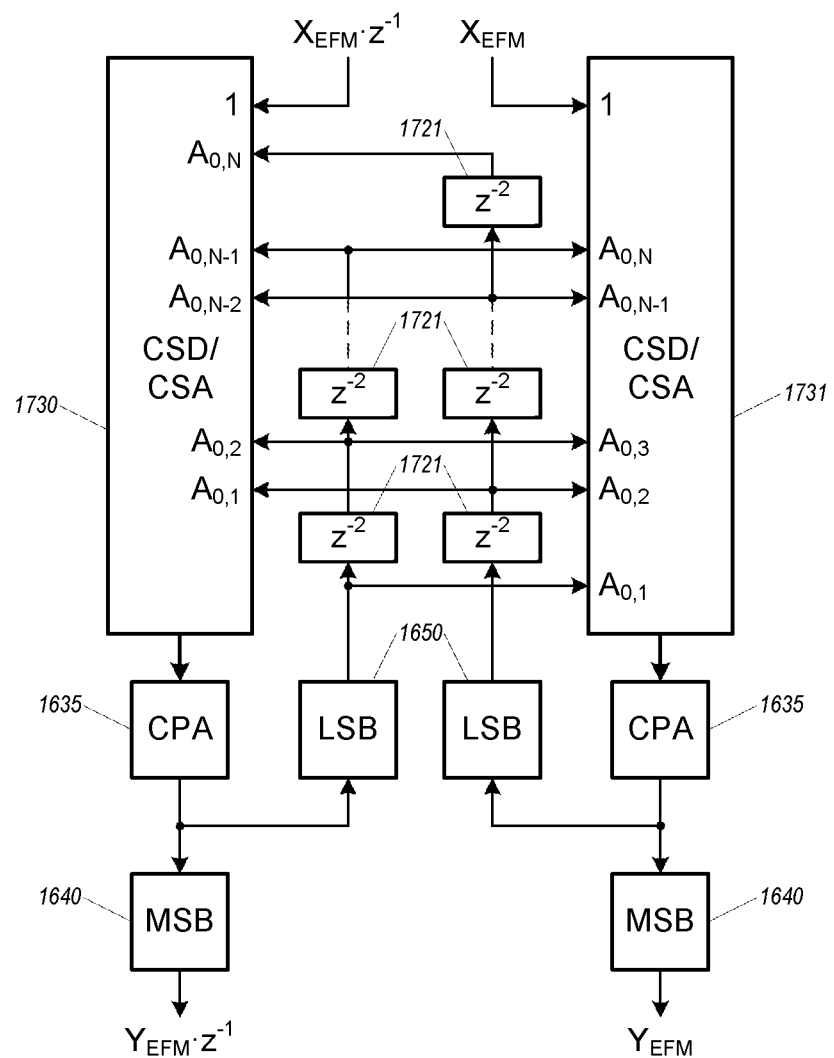
FIG. 17 shows a block diagram of a parallel implementation of an EFM.

In order to produce a wider (P>2) parallel CIC QNS structure, it is relatively straight-forward for a designer to follow the same strategy (unrolling via Equation 7) as is used to produce a parallel IIR filter as in FIG. 15 to build a wider version of $1/\text{NTF}_{CIC}(z)$ 2010. The wider version of $\text{NTF}_{CIC}(z)$ 2020 is constructed simply by placing P identical CSD/CSA/CPA 2520 and 2525 structures and connecting them with appropriate delay elements $z^{-P}$ to produce a parallel version, similar to what is shown in FIG. 25.

Alternate Implementation Strategies of Parallel CIC QNS

Other than the one taken in FIG. 25, there are several other possible strategies than can be taken to implement the feed-forward filters 2010 and 2020.

One strategy would be to split one or the other of the parallel filters into multiple cascaded parallel stages. For example, $1/\text{NTF}_{CIC}(z)=1/(1-z^{-1})^3=1/(1-3\cdot z^{-1}+3\cdot z^{-1}-z^{-3})$ can be factorized into three cascaded parallel $1/(1-z^{-1})$ stages (i.e. the integrator elements 2110 in FIG. 21) each of which is implemented using techniques shown in FIG. 15. Similarly $1/\text{NTF}_{CIC}(z)=1/(1-2\cdot z^{-1}+2\cdot z^{-1}-z^{-3})$ can be factorized into two cascaded parallel stages, one implementing $1/(1-z^{-1})$ and the second implementing $1/(1-z^{-1}+z^{-2})$. Depending upon the filter coefficients, it may be more hardware efficient or have lower latency to implement these cascades than it is to implement the filters as a single block. As will be understood by the skilled worker, $\text{NTF}_{CIC}(z)$ can be similarly factorized and implemented as a cascade of smaller filters.

Another strategy would be to instead of constructing P different $1/\text{NTF}_{CIC}(z)$ SOP structures, to construct P identical structures, which may be beneficial if the implementation were to be done as a full-custom digital block as opposed to one that is implemented using automated digital synthesis, placement, and routing tools. This approach can be used to exploit certain peculiarities in the coefficients and improve implementation efficiencies. One example of this appears when unrolling $1/\text{NTF}_{CIC}(z)=1/(1-2\cdot z^{-1}+2\cdot z^{-1}-z^{-3})$ by successive application of Equation 7, as shown in Equation 10:

$$\frac{1}{NTF_{CIC,0}} = \frac{1}{1-2\cdot z^{-1}+2\cdot z^{-2}-z^{-3}}$$

$$\frac{1}{NTF_{CIC,1}} = \frac{1+2\cdot z^{-1}}{1-2\cdot z^{-2}+3\cdot z^{-3}-2\cdot z^{-4}}$$

$$\frac{1}{NTF_{CIC,2}} = \frac{1+2\cdot z^{-1}+2\cdot z^{-2}}{1-1\cdot z^{-3}+2\cdot z^{-4}-2\cdot z^{-5}}$$

$$\frac{1}{NTF_{CIC,3}} = \frac{1+2\cdot z^{-1}+2\cdot z^{-2}+z^{-3}}{1-z^{-6}}$$

Equation 10

After unrolling this filter three times, the denominator has only a single non-zero coefficient other than 1, $A_{3,6}=-1$, meaning that a six-sample latency is allowed in the implementation. This, combined with the fact that the numerator coefficients $B_{3,i}$ are all 1 or 2, results in a particularly efficient implementation using identical structures.

It may also not be necessary to fully unroll the parallel IIR filter; it may well be that partial unrolling reduces the critical path sufficiently in order to meet the desired throughput.

Beyond these strategies, any other strategy for implementing parallel IIR filters can be applied without issue. So long as the feed-forward filters 2010 and 2020 faithfully implement parallel versions of $1/NTF_{CIC}(z)$ and $NTF_{CIC}(z)$, the CIC QNS structure will function correctly.

Specific Application to Advance Embodiments

There are many advantages that the present disclosure allows in the construction of parallel QNS structures, specifically: extremely high QNS throughput can be achieved by building wide parallel structures; a feedback filter around a nonlinear operator is replaced with two feed-forward filters that contain only linear operators, allowing a great deal of existing DSP filter implementation theory to be brought to bear; the requirement to evaluate multiple large SOP structures in series is eliminated; and, a large number of possible NTF(z)'s can be readily implemented.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

In the context of the present disclosure, elements can be said to be operationally connected to each other when, for example, a signal present in one element can be communicated to another element. Further, elements can be said to be operationally connected when an action in, or state of, one element can be controlled by, or related to, an action in, or a state of, another element.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

The invention claimed is:

1. A quantization noise-shaping device comprising:
a first feed-forward filter having a first transfer function, the first feed-forward filter to receive an input digital signal and to output a first filtered digital signal, the first filtered digital signal being a function of the first transfer function;
a quantizer to receive the first filtered signal and to output a quantizer output signal, the quantizer output signal having a lower amplitude resolution than that of the first filtered signal; and
a second feed-forward filter having a second transfer function, the second feed-forward filter to receive the quantizer output signal and to output a second filtered digital signal, the second filtered digital signal being a function of the quantizer output signal and of the second transfer function,
the quantization noise-shaping device having a target noise transfer function, the second feed-forward filter being configured to have the second transfer function equal to the target noise transfer function,
the first feed-forward filter being configured to have the first transfer function substantially equal to one over the second transfer function.

2. The device of claim 1 wherein:
the input digital signal spans a frequency range;
the noise transfer function has a finite gain for all frequencies within the frequency range; and
the noise transfer function, NTF(z), can be represented as $$NTF(z) = \frac{\sum_{i=0}^{N} B_i \cdot z^{-i}}{1 - \sum_{i=1}^{N} A_i \cdot z^{-i}}$$

with the coefficients $B_i$ and $A_i$ being integer values.

3. The device of claim 1 wherein the first feed-forward filter is an infinite impulse response filter and the second feed-forward filter is a finite impulse response filter.

4. The device of claim 1 wherein the noise transfer function is of the form $(1-z^{-1})^N$, N being an integer.

5. The device of claim 1 wherein the quantizer is a most significant bit (MSB) operator, the MSB operator to receive first filtered signal data words, the first filtered signal data words being data words of the first filtered signal, the MSB operator to output the most significant bits of the first filtered signal data words, the most significant bits of the first filtered signal data words constituting the quantizer output signal received at the second feed-forward filter.

6. The device of claim 5 wherein the MSB operator is a first MSB operator, the device further comprising:
a least significant bit (LSB) operator to receive initial input signal data words, the initial input signal data words being data words from an initial input signal, the LSB operator to output the least significant bits of the initial input signal data words, the least significant bits of the initial input signal data words constituting the input digital signal that is received at the first feed-forward filter;
a second MSB operator to receive the initial input signal data words and to output the most significant bits of initial input signal data words; and an adder to add the most significant bits of the initial input signal data words to second filtered digital signal data words, the second filtered digital signal data words being data words of the second filtered digital signal.

7. The device of claim 1 wherein the first feed-forward filter has a parallel processing structure.

8. The device of claim 1 wherein the second feed-forward filter has a parallel processing structure.

9. A multi-bit digital-to-analog system comprising:
a quantization noise-shaping device having;
  a first feed-forward filter having a first transfer function, the first feed-forward filter to receive an input digital signal and to output a first filtered digital signal, the first filtered digital signal being a function of the first transfer function;
  a quantizer to receive the first filtered signal and to output a quantizer output signal, the quantizer output signal having a lower amplitude resolution than that of the first filtered signal; and
  a second feed-forward filter having a second transfer function, the second feed-forward filter to receive the quantizer output signal and to output a second filtered digital signal, the second filtered digital signal being a function of the quantizer output signal and of the second transfer function,
  the noise-shaping device having a target noise transfer function, the second feed-forward filter being configured to have the second transfer function equal to the target noise transfer function,
  the first feed-forward filter being configured to have the first transfer function substantially equal to one over the second transfer function;
  and,
a digital-to-analog converter (DAC) operationally connected to the quantization noise-shaping device, the DAC to receive a quantization noise-shaping device output signal and to convert the quantization noise-shaping device output signal into a discrete time analog signal.

10. The multi-bit digital-to-analog system of claim 9 further comprising a reconstruction filter to receive the discrete-time analog signal and to construct an analog signal from the discrete-time analog signal.

11. The multi-bit digital-to-analog system of claim 9 wherein:
the input digital signal spans a frequency range;
the noise transfer function has a finite gain for all frequencies within the frequency range; and
the noise transfer function, NTF(z), can be represented as $$NTF(z) = \frac{\sum_{i=0}^{N} B_i \cdot z^{-1}}{1 - \sum_{i=1}^{N} A_i \cdot z^{-1}}$$

with the coefficients $B_i$ and $A_i$ being integer values.

12. The multi-bit digital-to-analog system of claim 9 wherein the first feed-forward filter is an infinite impulse response filter and the second feed-forward filter is a finite impulse response filter.

13. The multi-bit digital-to-analog system of claim 9 wherein the noise transfer function is of the form $(1-z^{-1})^N$, N being an integer.

14. The multi-bit digital-to-analog system of claim 9 wherein the quantizer is a most significant bit (MSB) operator, the MSB operator to receive first filtered signal data words, the first filtered signal data words being data words of the first filtered signal, the MSB operator to output the most significant bits of the first filtered signal data words, the most significant bits of the first filtered signal data words constituting the quantizer output signal received at the second feed-forward filter.

15. The multi-bit digital-to-analog system of claim 14 wherein the MSB operator is a first MSB operator, the device further comprising:
  a least significant bit (LSB) operator to receive initial input signal data words, the initial input signal data words being data words from an initial input signal, the LSB operator to output the least significant bits of the initial input signal data words, the least significant bits of the initial input signal data words constituting the input digital signal that is received at the first feed-forward filter;
  a second MSB operator to receive the initial input signal data words and to output the most significant bits of initial input signal data words; and
  an adder to add the most significant bits of the initial input signal data words to second filtered digital signal data words to obtain the quantization noise-shaping device output signal, the second filtered digital signal data words being data words of the second filtered digital signal.

16. The multi-bit digital-to-analog system of claim 9 wherein the first feed-forward filter has a parallel processing structure.

17. The multi-bit digital-to-analog system of claim 9 wherein the second feed-forward filter has a parallel processing structure.

* * * * *